(12) United States Patent
Choi et al.

(10) Patent No.: US 9,911,941 B2
(45) Date of Patent: Mar. 6, 2018

(54) ORGANIC LIGHT EMITTING DISPLAY DEVICE AND METHOD OF MANUFACTURING ORGANIC LIGHT EMITTING DISPLAY DEVICE

(71) Applicant: Samsung Display Co., Ltd., Yongin-si, Gyeonggi-Do (KR)

(72) Inventors: Beohm-Rock Choi, Seoul (KR); Ki-Hoon Ha, Asan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 15/138,705

(22) Filed: Apr. 26, 2016

(65) Prior Publication Data

US 2016/0322595 A1     Nov. 3, 2016

(30) Foreign Application Priority Data

Apr. 30, 2015  (KR) ........................ 10-2015-0061982

(51) Int. Cl.
*H01L 29/08*  (2006.01)
*H01L 51/52*  (2006.01)
*H01L 27/32*  (2006.01)

(52) U.S. Cl.
CPC ...... *H01L 51/5212* (2013.01); *H01L 27/3216* (2013.01); *H01L 51/5228* (2013.01); *H01L 27/3279* (2013.01)

(58) Field of Classification Search
CPC ................................... H01L 51/5212
USPC .......................................... 257/40
See application file for complete search history.

(56) References Cited

U.S. PATENT DOCUMENTS

2013/0214306 A1 *  8/2013  Hayashi ............... H01L 33/08
                                                              257/89
2014/0062943 A1 *  3/2014  Choi ..................... G06F 3/0412
                                                              345/174

FOREIGN PATENT DOCUMENTS

EP         EP 1973162 A2 *  9/2008  ......... H01L 27/3265
KR         10-2014-0086452 A  7/2014

* cited by examiner

*Primary Examiner* — Ajay K Arora
(74) *Attorney, Agent, or Firm* — Innovation Counsel LLP

(57) ABSTRACT

An organic light emitting display device may include a first auxiliary electrode, a first first-group first-color corresponding electrode, a second first-group first-color corresponding electrode, and a first group electrode. The second first-group first-color corresponding electrode is larger than the first first-group first-color corresponding electrode. The first group electrode overlaps both the first first-group first-color corresponding electrode and the second first-group first-color corresponding electrode. A first portion of the first group electrode directly contacts the first auxiliary electrode and is positioned closer to the first first-group first-color corresponding electrode than to the second first-group first-color corresponding electrode.

20 Claims, 24 Drawing Sheets

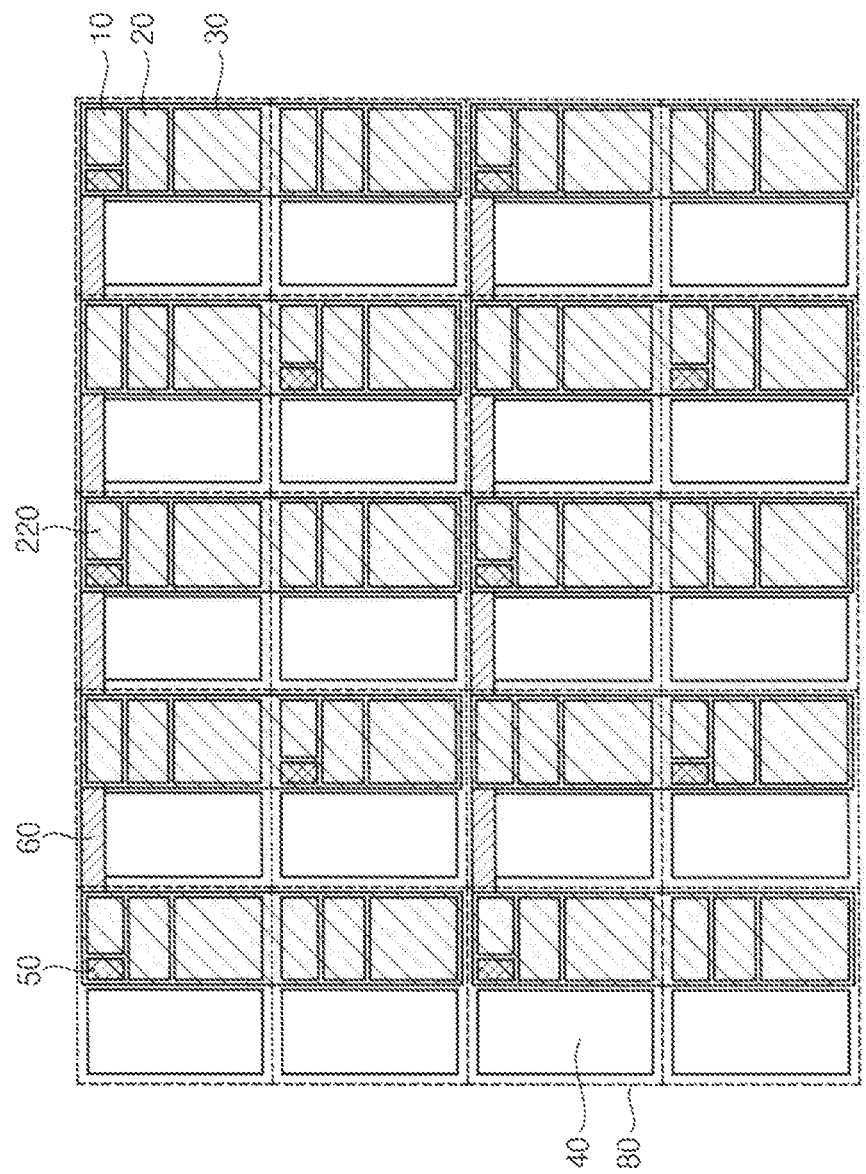

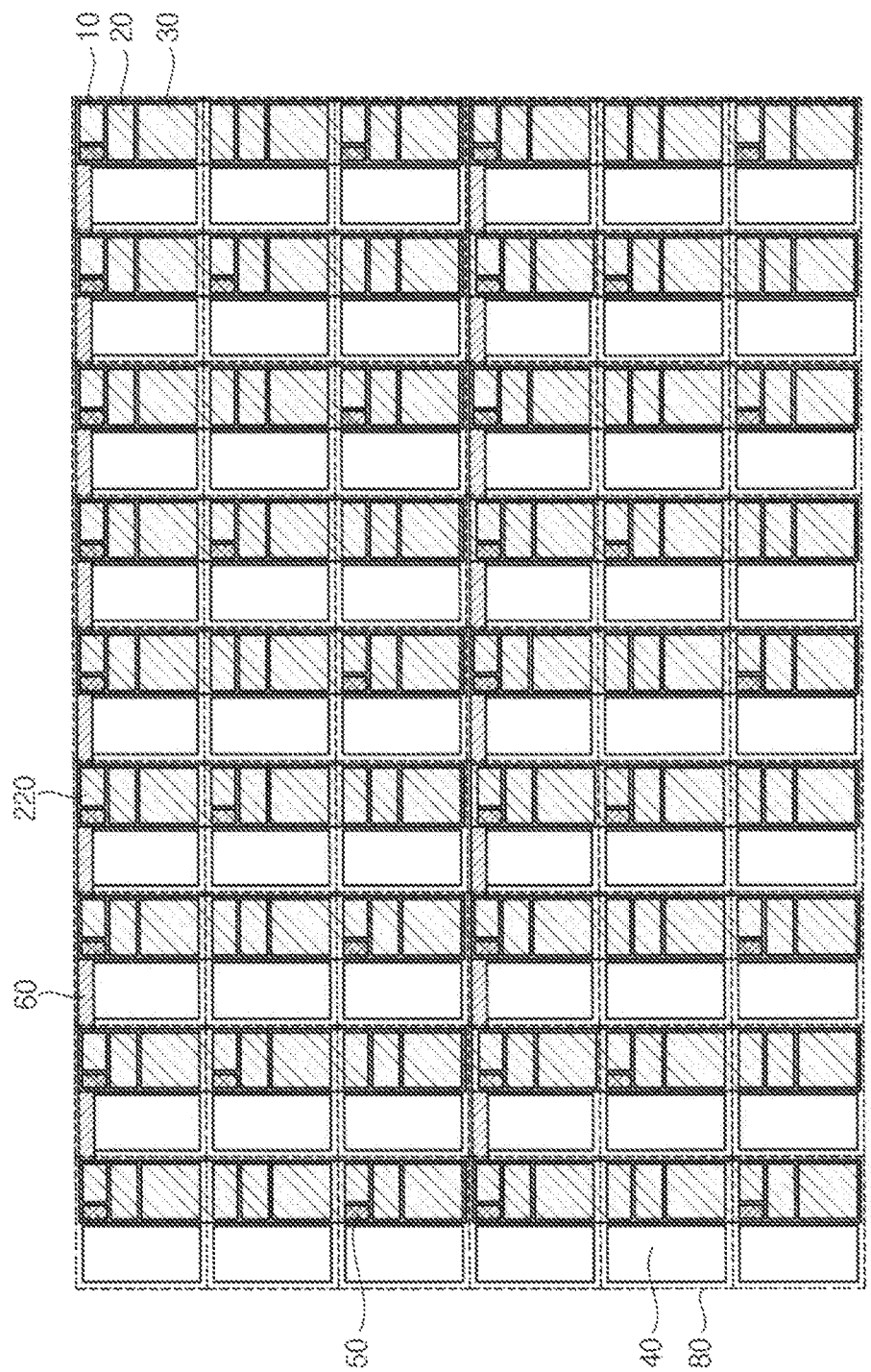

ORGANIC LIGHT EMITTING DISPLAY DEVICE AND METHOD OF MANUFACTURING ORGANIC LIGHT EMITTING DISPLAY DEVICE

CROSS REFERENCE TO RELATED APPLICATION(S)

This application claims priority to Korean Patent Application No. 10-2015-0061982 filed on Apr. 30, 2015 in the Korean Intellectual Property Office (KIPO); the disclosure of the Korean Patent Application is incorporated by reference herein in its entirety.

BACKGROUND

1. Field

The technical field is related to a display device, e.g., an organic light emitting display device, and a method of manufacturing the display device.

2. Description of the Related Art

An organic light emitting display device includes pixels having organic light emitting diodes. The organic light emitting diodes may emit lights having wavelengths that depend on organic materials included in the organic light emitting diodes. For example, the organic light emitting diodes may organic materials corresponding to a red color light, a green color light, and a blue color light. The organic light emitting display device may display an image by mixing lights of different colors.

SUMMARY

Example embodiments may be related to an organic light emitting display device that includes substantial transparent areas capable of transmitting external light.

Example embodiments may be related to a method for manufacturing the organic light emitting display device.

Example embodiments may be related to an organic light emitting display device. The organic light emitting display device may include a substrate, a first auxiliary electrode, a first first-group first-color corresponding electrode, a second first-group first-color corresponding electrode, and a first group electrode. The first auxiliary electrode may overlap the substrate. The second first-group first-color corresponding electrode may be larger than the first first-group first-color corresponding electrode. The first group electrode may overlap both the first first-group first-color corresponding electrode and the second first-group first-color corresponding electrode (i.e., may be positioned over both the first first-group first-color corresponding electrode and the second first-group first-color corresponding electrode in a direction perpendicular to a back side or bottom side of the substrate). A first portion of the first group electrode may directly contact the first auxiliary electrode (through a first contact hole) and may be positioned closer to the first first-group first-color corresponding electrode than to the second first-group first-color corresponding electrode.

A first edge of the first first-group first-color corresponding electrode may be aligned with a first edge of the second first-group first-color corresponding electrode in a first direction, i.e., a geometric line that extends in the first direction may pass (and coincide) both the first edge of the first first-group first-color corresponding electrode and the first edge of the second first-group first-color corresponding electrode. The first portion of the first group electrode may be positioned between the first first-group first-color corresponding electrode and a first transparent portion of the substrate in a second direction in a plan view of the organic light emitting display device. The second direction may be perpendicular to the first direction.

A first edge of the first first-group first-color corresponding electrode may be aligned with a first edge of the second first-group first-color corresponding electrode in a first direction. The first first-group first-color corresponding electrode may be shorter than the second first-group first-color corresponding electrode in a second direction in a plan view of the organic light emitting display device.

The organic light emitting display device may include the following elements: a first second-group first-color corresponding electrode; a second second-group first-color corresponding electrode, which may be larger than the first second-group first-color corresponding electrode; and a second group electrode, which may be insulated from the first group electrode and may overlap both the first second-group first-color corresponding electrode and the second second-group first-color corresponding electrode, A first portion of the second group electrode may directly contact the first auxiliary electrode (through a second contact hole) and may be positioned closer to the first second-group first-color corresponding electrode than to the second second-group first-color corresponding electrode.

The first second-group first-color corresponding electrode may be as large as the first first-group first-color corresponding electrode. The second second-group first-color corresponding electrode may be as large as the second first-group first-color corresponding electrode.

The second first-group first-color corresponding electrode may be positioned between the first portion of the first group electrode and the first portion of the second group electrode in a first direction in a plan view of the organic light emitting display device.

The second first-group first-color corresponding electrode and the first second-group first-color corresponding electrode may be positioned between the first first-group first-color corresponding electrode and the second second-group first-color corresponding electrode in the first direction in the plan view of the organic light emitting display device.

The organic light emitting display device may include a third first-group first-color corresponding electrode, which may be larger than the first first-group first-color corresponding electrode and may overlap the first group electrode. The first first-group first-color corresponding electrode may be positioned between the third first-group first-color corresponding electrode and the second first-group first-color corresponding electrode. The first first-group first-color corresponding electrode, the second first-group first-color corresponding electrode, and the second second-group first-color corresponding electrode may be positioned between the third first-group first-color corresponding electrode and the first second-group first-color corresponding electrode.

The organic light emitting display device may include a third first-group first-color corresponding electrode, which may be smaller than the second first-group first-color corresponding electrode and may overlap the first group electrode. The second first-group first-color corresponding electrode may be positioned between the third first-group first-color corresponding electrode and the first first-group first-color corresponding electrode. The first first-group first-color corresponding electrode, the second first-group first-color corresponding electrode, and the first second-group first-color corresponding electrode may be positioned between the third first-group first-color corresponding electrode and the second second-group first-color corresponding electrode. A second portion of the first group electrode may directly contact the first auxiliary electrode and may be positioned closer to the third first-group first-color corresponding electrode than to the second first-group first-color corresponding electrode. The first portion of the first group electrode may be positioned between the second portion of the first group electrode and the first portion of the second group electrode.

The organic light emitting display device may include the following elements: a second auxiliary electrode, which may overlap the substrate and extends parallel to the first auxiliary electrode; a first third-group first-color corresponding electrode; a second third-group first-color corresponding electrode, which may be larger than the first third-group first-color corresponding electrode; a third group electrode, which may overlap both the first third-group first-color corresponding electrode and the second third-group first-color corresponding electrode, wherein a first portion of the third group electrode may directly contact the second auxiliary electrode (through a third contact hole) and may be positioned closer to the first third-group first-color corresponding electrode than to the second third-group first-color corresponding electrode; and a bridge electrode, which may be shorter than the first third-group first-color electrode in a first direction. A first end of the bridge electrode may directly contact the first group electrode. A second end of the bridge electrode may directly contact the third group electrode.

A second direction may be perpendicular to the first direction. In embodiments, no portion of the first group electrode that directly contacts the first auxiliary electrode may be aligned with the first portion of the third group electrode in the second direction in a plan view of the organic light emitting display device. In other words, in embodiments, in the plan view of the organic light emitting display device, any geometric line that extends in the second direction would not pass (or cross) both the first portion of the third group electrode and any portion of the first group electrode that directly contacts the first auxiliary electrode.

A second direction may be perpendicular to the first direction. The bridge electrode may be positioned between first first-group first-color corresponding electrode or the second first-group first-color corresponding electrode and the first third-group first-color corresponding electrode or the second third-group first-color corresponding electrode in the second direction in a plan view of the organic light emitting display device. The first first-group first-color corresponding electrode may be positioned between the first portion of the first group electrode and the bridge electrode in the second direction in the plan view of the organic light emitting display device.

The bridge electrode may be positioned between first first-group first-color corresponding electrode and the first third-group first-color corresponding electrode or the second third-group first-color corresponding electrode in the second direction in the plan view of the organic light emitting display device. In embodiments, no bridge electrode is aligned with the second first-group first-color corresponding electrode in the second direction in the plan view of the organic light emitting display device and directly contacts both the first auxiliary electrode and the second auxiliary electrode. In other words, in embodiments, in the plan view of the organic light emitting display device, no geometric line that extends in the second direction passes (or crosses) both the second first-group first-color corresponding electrode and any bridge electrode that directly contacts both the first auxiliary electrode and the second auxiliary electrode.

An edge of the bridge electrode may be aligned with each of the first first-group first-color corresponding electrode and the first portion of the first group electrode in the second direction in the plan view of the organic light emitting display device. In other words, in the plan view of the organic light emitting display device, a geometric line that extends in the second direction may pass (or cross) all of the edge of the bridge electrode, the first first-group first-color corresponding electrode, and the first portion of the first group electrode. The edge of the bridge electrode may be aligned with the second third-group first-color corresponding electrode in the second direction in the plan view of the organic light emitting display device.

The bridge electrode may be positioned between second first-group first-color corresponding electrode and the first third-group first-color corresponding electrode or the second third-group first-color corresponding electrode in the second direction in the plan view of the organic light emitting display device. In embodiments, no bridge electrode is aligned with the first first-group first-color corresponding electrode in the second direction in the plan view of the organic light emitting display device and directly contacts both the first auxiliary electrode and the second auxiliary electrode. An edge of the bridge electrode may be aligned with each of the second first-group first-color corresponding electrode and the second third-group first-color corresponding electrode in the second direction in the plan view of the organic light emitting display device.

The organic light emitting display device may include the following elements: a first first-group second-color corresponding electrode, which may be longer than the first first-group first-color corresponding electrode in the second direction; and a second first-group second-color corresponding electrode, which may be longer than the first first-group first-color corresponding electrode in the second direction. In embodiments, no bridge electrode is aligned with either of the first first-group second-color corresponding electrode and the second first-group second-color corresponding electrode in the second direction and directly contacts both the first auxiliary electrode and the second auxiliary electrode.

The organic light emitting display device may include the following elements: a first first-group third-color corresponding electrode, which may be longer than the first first-group first-color corresponding electrode in the second direction; and a second first-group third-color corresponding electrode, which may be longer than the first first-group first-color corresponding electrode in the second direction. In embodiments, not any bridge electrode is aligned with either of the first first-group third-color corresponding electrode and the second first-group third-color corresponding electrode in the second direction and directly contacts both the first auxiliary electrode and the second auxiliary electrode.

According example embodiments, an organic light emitting display device includes a substrate, a semiconductor element, N auxiliary electrodes, [M*N] pixel electrode sets (or color-corresponding electrode sets, first-type electrodes, or first electrodes) that form an electrode-set array of M electrode-set rows by N electrode-set columns, a pixel defining layer, a light emitting layer, at most [(M/G)*N] or [(M/G+1)*N] group electrodes (or second-type electrode or second electrode) that are insulated from one another, and at most [(M/G) multiplied by (N−1)] or [(M/G+1) multiplied by (N−1)] bridge electrodes that each directly contact two group electrodes of the at most [(M/G)*N] or [(M/G+1)*N]

group electrodes. The M, N, and G are integers greater than 1. The G represents the number of pixel electrode sets included in each group that corresponds to (and overlap) one group electrode of the group electrodes. Associated with the M, N, and the symbol * represents "multiplied by", the symbol / represents "divided by", the symbol + represents "plus", and the symbol − represents "minus". The substrate includes a plurality of pixel regions. Each pixel region of the pixel regions has a transparent region and a sub-pixel region that corresponds to one pixel-electrode set of the pixel electrode sets, and the pixel regions form a pixel region array of M rows by N columns, corresponding to the electrode-set array. The group electrodes directly contact the auxiliary electrodes at no more than [(M/G)*(G−1)*N] or [(M/G+1)*(G−1)*N] contact points through no more than [(M/G)*(G−1)*N] or [(M/G+1)*(G−1)*N] contact holes. Each group electrode may directly contact a corresponding auxiliary electrode through no more than G−1 contract holes.

The semiconductor element is disposed in a first sub-pixel region on the substrate. A first auxiliary electrode is spaced apart from the semiconductor element in the first sub-pixel region on the substrate. A first pixel electrode set is disposed in the first sub-pixel region on the semiconductor element and the first auxiliary electrode. The pixel defining layer insulates the pixel electrode sets from one another and insulates pixel electrodes in each of the pixel electrode sets from one another. The pixel defining layer has the contact holes for partially exposing the auxiliary electrode. The light emitting layer is disposed on a pixel electrode of the first pixel electrode set.

Along each of the N electrode-set columns, at most (M/G) or (M/G)+1 group electrodes are aligned in a first direction and expose transparent regions. The group electrodes direct contact the auxiliary electrodes through the contact holes. The bridge electrodes partially overlap the transparent regions. Each of the bridge electrodes directly contacts and electrically connects two immediately neighboring group electrodes and extends in a second direction that is perpendicular to the first direction.

The N auxiliary electrodes may extend along the N electrode-set columns in the first direction.

The semiconductor element may represent a transistor and may include an active layer on the substrate, a gate electrode on the active layer, and source and drain electrodes on the gate electrode.

The first auxiliary electrode and active layer may be disposed at the same level, and the first auxiliary electrode and the active layer are simultaneously formed using the same material.

The sub-pixel regions may be grouped by two sub-pixel regions in the first direction, corresponding to grouping of the pixel electrode sets, wherein G=2. Each group electrode may correspond to (and overlap) two adjacent sub-pixel regions in a same column.

The contact holes may be located in portions of the grouped sub-pixel regions where the group electrodes are disposed.

The contact holes may be located in the grouped sub-pixel region that is located at a (J)th column or a (J+1)th column among the first through (N)th columns in the same row, where J is an odd number that is more than 1 and not more than N−1.

The contact holes may be arranged in a zigzag pattern.

The sub-pixel regions may be grouped by at least three adjacent sub-pixel regions in the first direction, corresponding to grouping of the pixel electrode sets, wherein G is greater than or equal to 3. Each group electrode may correspond to (and overlap) at least three adjacent sub-pixel regions that immediately neighbor one another in the first direction.

Example embodiments may be related to a method of manufacturing organic light emitting display device with one or more of the aforementioned features.

A first set of bridge electrodes may be formed using a first fine metal mask such that the bridge electrodes partially overlap edges of some of the group electrodes.

The group electrodes may be formed using a second fine metal mask.

A second set of bridge electrode may be formed using a third fine metal mask.

The group electrodes and the bridge electrodes may be formed in a same process step.

According to embodiments, the number and/or sizes of bridge electrodes that overlap transparent regions may be minimized. Advantageously, transmittance of the organic light emitting display device may be maximized. According to embodiments, the total number of contact holes in the organic light emitting display device may be minimized. Accordingly, manufacturing cost of the organic light emitting display device may be advantageously minimized. According embodiments, in manufacturing an organic light emitting display device, the number of mask processes may be minimized. Advantageously, manufacturing cost of the organic light emitting display device may be minimized.

BRIEF DESCRIPTION OF THE DRAWINGS

FIG. 17, FIG. 18, FIG. 19, and FIG. 20 are plan views for describing a sequence of forming second-type electrodes (or second electrodes for conciseness) and bridge electrodes according to example embodiments.

FIG. 22A and FIG. 22B are plan views for describing second-type electrodes (or second electrodes for conciseness) and bridge electrodes associated with FIG. 21 according to example embodiments.

DESCRIPTION OF EMBODIMENTS

Figure 1:
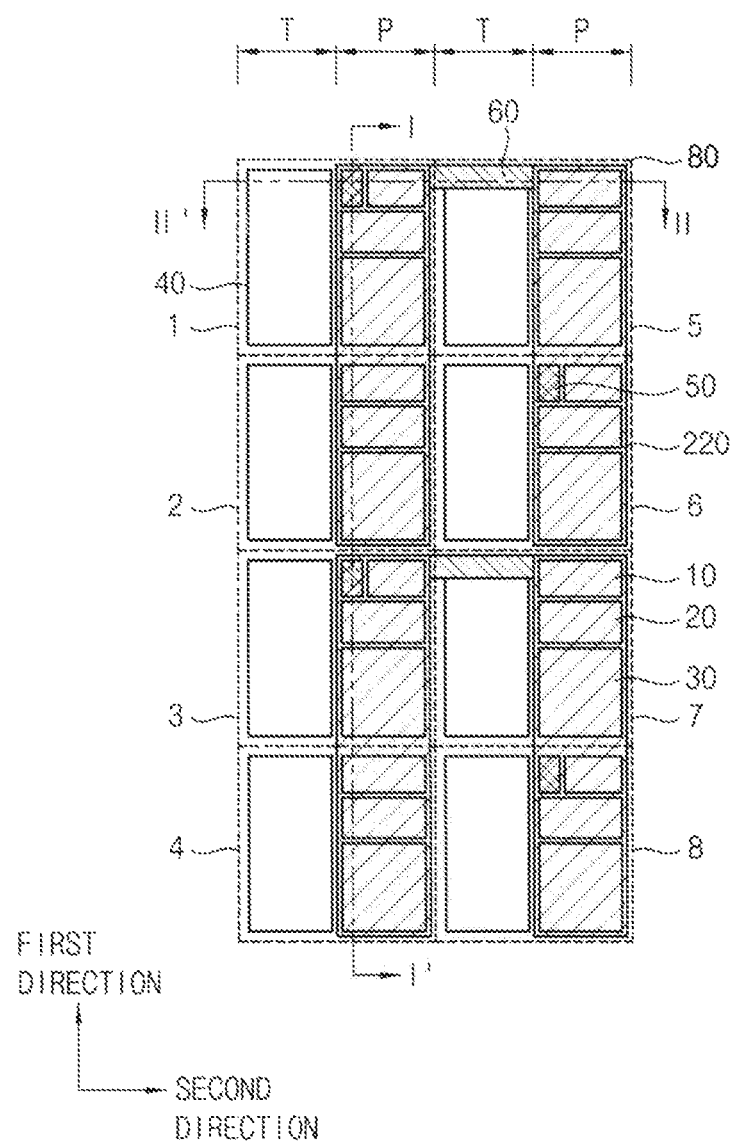
FIG. 1 is a plan view illustrating an organic light emitting display device according to example embodiments.

Example embodiments are described with reference to the accompanying drawings. Although the terms "first", "second", etc. may be used herein to describe various elements, these elements should not be limited by these terms. These terms may be used to distinguish one element from another element. Thus, a first element recited in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intervening element (except environmental elements such as air) may be intended between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art.

Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "directly connect", "indirectly connect", or "electrically connect". The term "insulate" may mean "electrically insulate". The term "conductive" may mean "electrically conductive". The term "electrically connected" may mean "electrically connected without any intervening transistors" or "electrically connected through no intervening transistors".

FIG. 1 is a plan view illustrating an organic light emitting display device according to example embodiments.

Referring to FIG. 1, the organic light emitting display (OLED) device may include a substrate 80, a semiconductor element, an auxiliary electrode, a first electrode, a pixel defining layer, a light emitting layer, group electrodes 220 (i.e., second-type electrodes 220 or second electrode 220 for conciseness), and a bridge electrode 60.

In example embodiments, (the substrate 80 of) the OLED device may include a plurality of pixel regions 1, 2, 3, 4, 5, 6, 7, and 8. One pixel region may include a transparent region T and a sub-pixel region P. Here, a transparent window 40 may be located in the transparent region T, and first through third sub-pixels 10, 20, and 30 may be disposed in the sub-pixel region P. An external light may travel through the transparent window. Therefore, s user of the OLED device may see an image of an object that is located in the rear of the OLED device. In example embodiments illustrated in FIG. 1, one sub-pixel region P may correspond to one transparent window 40. In embodiments, a plurality of sub-pixel regions P may correspond to one transparent window 40.

The first through third sub-pixels 10, 20, and 30 may be disposed in a sub-pixel region P. In example embodiments, at least two adjacent sub-pixel regions P among the sub-pixel regions P may be grouped. For example, the pixel regions may be arranged in M rows and N columns on the substrate 80, where M and N are each an integer greater than 1.

When the sub-pixel regions P are grouped with adjacent two sub-pixel regions P among the sub-pixel regions P in a first direction, the adjacent two sub-pixel regions P that are located at a (K)th row and a (K+1)th row among the first through (M)th rows in the same column may be grouped, where K is an odd number that is more than 1 and not more than M−1. The second electrode 220 is disposed in a grouped sub-pixel region P where the adjacent two sub-pixel regions P are grouped in the first direction, and the second electrode 220 may be integrally formed in the grouped sub-pixel region P. The second electrode 220 that is integrally formed in the grouped sub-pixel region P is defined as a grouped second electrode 220, and each of the grouped second electrodes 220 may be disposed in each of the grouped sub-pixel regions P. The grouped second electrodes 220 may be spaced apart from each other.

Similarly, when the sub-pixel regions P are grouped with at least three adjacent sub-pixel regions P among the sub-pixel regions P in the first direction, the second electrode 220 may be disposed in a grouped sub-pixel region P where the at least three adjacent sub-pixel regions P are grouped in the first direction. The second electrode 220 may be integrally formed in the grouped sub-pixel region, and the second electrode 220 that is integrally formed in the grouped sub-pixel region is defined as a grouped second electrode 220. Each of the grouped second electrodes 220 may be disposed in each of the grouped sub-pixel regions P, and the grouped second electrodes 220 may be spaced apart from each other.

The semiconductor element may be disposed in the sub-pixel region P on the substrate 80. In example embodiments, the semiconductor element may include an active layer, a source electrode, a drain electrode, and gate electrode. The semiconductor element may overlap the sub-pixel region P, and may be formed of a thin film transistor (TFT).

The auxiliary electrodes that are located at the sub-pixel regions P in the same column among the auxiliary electrodes may be integrally formed, and the auxiliary electrodes in the same column may extend along the first direction. Also, the auxiliary electrode and active layer may be disposed at the same level, and the auxiliary electrode and the active layer may be simultaneously formed using the same material. For example, the auxiliary electrodes and source and drain regions of the active layer each may serve as a metal by performing an impurity implantation process.

In example embodiments, the auxiliary electrode and the active layer of the semiconductor element are disposed at the same level but not being limited thereto. In some example embodiments, for example, the auxiliary electrode may be disposed at the same level with a gate electrode of the semiconductor element or source and drain electrode of the semiconductor element by using the same materials.

The first electrode may be disposed in the sub-pixel regions P on the semiconductor element and the auxiliary electrode.

The pixel defining layer may be disposed in at least two adjacent the sub-pixel regions P among the sub-pixel regions P in the first direction on the substrate 80. Here, the first direction may be parallel to an upper surface of the substrate 80. The pixel defining layer may have a contact hole partially exposing the auxiliary electrode, and the pixel defining layer may expose a portion of the first electrode. For example, the pixel defining layer may substantially surround the sub-pixel region P and the transparent region T.

In example embodiments, the contact hole 50 may be located in at least a portion of the grouped sub-pixel regions P where the grouped second electrode 220 is disposed. The contact holes 50 may be repeatedly located in the grouped sub-pixel region P that is located at a (J)th column or a (J+1)th column among the first through (N)th columns (where, J is an odd number that is more than 1 and not more than N−1) in the same row, and the contact holes 50 may be arranged in a zigzag pattern. As the contact hole 50 is located in the grouped sub-pixel region P, the total number of the contact hole 50 may be relatively decreased. Accordingly, a manufacturing cost of the OLED device may be reduced.

In FIG. 1, the contact hole 50 is disposed adjacent to the first sub-pixel 10, but the contact hole 50 may be disposed adjacent to the second sub-pixel 20 or the third sub-pixel 30.

The light emitting layer may be disposed on the first electrode that is partially exposed by the pixel defining layer.

The second electrode 220 may be disposed in at least two adjacent the sub-pixel regions P among the sub-pixel regions P in the first direction on the light emitting layer and the pixel defining layer, and the second electrode 220 may expose the transparent region T. The second electrode 220 may be in contact with the auxiliary electrode through the contact hole 50.

When the sub-pixels 10, 20, 30 are electrically connected through the second electrode 220, a voltage level of a first sub-pixel column (or row) may be different from a voltage of a last sub-pixel column (or row) by a IR drop. But, when a voltage that is applied to the auxiliary electrode is provided to the second electrode 220 by contacting the auxiliary electrode and the second electrode 220 through the contact hole 50, a difference of the voltage level between the first sub-pixel column and the last sub-pixel column in the same row may be reduced. Therefore, when the number of the contact hole 50 is increased, the difference of the voltage level may be reduced.

Also, as the second electrode 220 exposes the transparent region T, a transmittance may be increased. Meanwhile, when the second electrodes 220 may expose the transparent region T, the OLED device may not be driven because the grouped second electrodes 220 in the same row are not electrically connected to each other. But, above problem may be solved using the bridge electrode 60.

The bridge electrode 60 may be disposed in a portion of at least two adjacent the transparent regions T among the transparent regions T in the first direction, and the bridge electrode 60 may be electrically connected to the second electrodes 220 (e.g., the second electrodes 220 is adjacent to each other in a second direction that is perpendicular to the first direction) that are adjacent to the at least two adjacent the transparent regions T among the transparent regions T in the first direction. The bridge electrode 60 may extend in the second direction. Also, since only at most one bridge electrode 60 is disposed in a portion of two adjacent the transparent regions T among the transparent regions T in the first direction, a transmittance of the OLED device may be relatively increased.

In example embodiments, the number of the bridge electrode 60 may be minimized within a range capable of compensating the IR drop. When the number of the bridge electrode 60 is decreased, a manufacturing process may be simplified, and a manufacturing cost may be decreased. Also, a transmittance of the OLED device may be increased. But, when the number of the bridge electrode 60 is not enough, a voltage unbalance of the OLED device may occur. Therefore, the number of the bridge electrode 60 may be determined by considering the number of the contact hole 50.

A structure of the sub-pixels 10, 20, and 30 will be described below.

Figure 2:
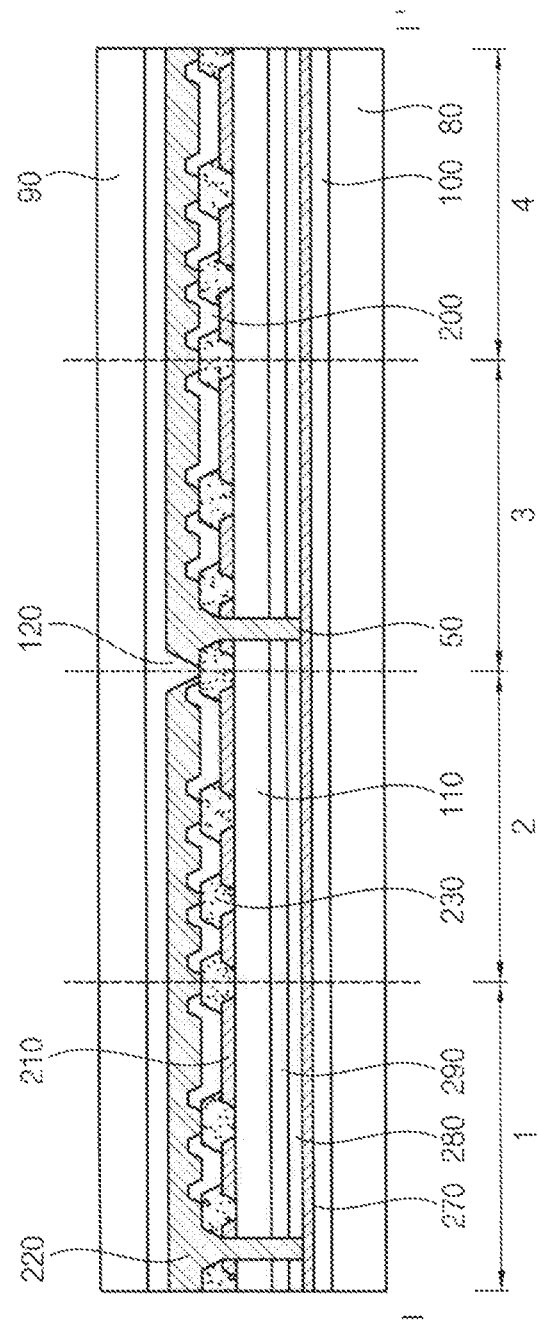
FIG. 2 is a cross-sectional view taken along a line I-I' of FIG. 1.

FIG. 2 is a cross-sectional view taken along a line I-I' of FIG. 1.

Referring to FIGS. 1 and 2, the OLED device may include a substrate 80, a buffer layer 100, a common electrode 270 (or auxiliary electrode 270), a first insulating layer 280, a second insulating layer 290, contact hole 50, sub-pixel electrodes 210 (or first-type electrodes 210 or first electrodes 210 for conciseness), a pixel defining layer 230, a light emitting layer 200, group electrodes 220 (or second electrodes 220), and a sealing substrate 90.

In example embodiments, as illustrated in FIG. 1, a sub-pixel region P of a first pixel region 1 and a sub-pixel region P of a second pixel region 2 may be grouped, and the sub-pixel regions P of the first and second pixel regions 1 and 2 may share a first second electrode 220. A sub-pixel region P of third pixel region 3 and a sub-pixel region P of a fourth pixel region 4 may be grouped, and the sub-pixel regions P of the third and fourth pixel regions 3 and 4 may share a second second electrode 220. Here, the first second electrode 220 (which is disposed in the first and second pixel regions 1 and 2) may be spaced and insulated from the second second electrode 220 (which is disposed in the third and fourth pixel regions 3 and 4). Each of the first second electrode 220 and the second second electrode 220 may have an island shape. The contact holes 50 may be located at the first pixel region 1 and the third pixel region 3, and a first auxiliary electrode 270 may directly contact and be electrically connected to each of the first second electrode 220 and the second second electrode 220 through the contact holes 50. In similar structures, a sub-pixel region P of a fifth pixel 5 and a sub-pixel region P of a sixth pixel 6 may be grouped, and the sub-pixel regions P of the fifth and sixth pixels 5 and 6 may share a third second electrode 220. A sub-pixel region P of seventh pixel 7 and a sub-pixel region P of an eighth pixel 8 may be grouped, and the sub-pixel regions P of the seventh and eighth pixels 7 and 8 may share a fourth second electrode 220. Here, the third second electrode 220 (which is disposed in the fifth and sixth pixel regions 5 and 6) may be spaced and insulated from the fourth second electrode 220 (which is disposed in the seventh and eighth pixel regions 7 and 8). Each of the third second electrode 220 and the fourth second electrode 220 may have the island shape. The contact holes 50 may be located at the sixth pixel region 6 and the eighth pixel region 8, and a second auxiliary electrode 270 may be electrically connected to each of the second electrodes 220 through the contact holes 50.

The substrate 80 may include a transparent insulating substrate. For example, the substrate 80 may be composed of a glass substrate, a quartz substrate, a transparent resin substrate, etc. In this case, the transparent resin substrate may include a polyimide-based resin, an acryl-based resin, a polyacrylate-based resin, a polycarbonate-based resin, a polyether-based resin, a sulfonic acid-based resin, a polyethyleneterephthalate-based resin, etc.

The buffer layer 100 may be disposed on substrate 80. The buffer layer 100 may prevent the phenomenon diffusing a metal atom or impurities from the substrate 80, and a substantially uniform pattern may be obtained by controlling a rate of a heat transfer during a crystallization process for forming the active layer 275. Also, when a surface of the substrate 80 is relatively irregular, a buffer layer 100 may perform a role in order to improve the flatness of the surface of the substrate 80. The buffer layer 100 may be formed of a silicon compound. For example, the buffer layer 100 may include silicon oxide, silicon nitride, silicon oxynitride, silicon oxycarbide, silicon carbonitride, etc. These may be used alone or in a suitable combination thereof. A buffer layer 100 may have a single layer structure or a multi-layer structure including a silicon compound. For example, the buffer layer 100 may be formed a single layer structure or a multi-layer structure including silicon oxide, silicon nitride, silicon oxynitride, silicon oxycarbide and/or silicon carbonitride on the substrate 80.

The auxiliary electrode 270 may extend in a first direction and may be disposed on the buffer layer 100. The auxiliary electrode 270 may be composed of silicon. In some example embodiments, the auxiliary electrode 270 may be composed oxide semiconductor including two-component compound (ABx), ternary compound (ABxCy), four-component compound (ABxCyDz), etc. These compounds contain indium (In), zinc (Zn), gallium (Ga), tin (Sn), titanium (Ti), aluminum (Al), hafnium (Hf), zirconium (Zr), magnesium (Mg), etc. These may be used alone or in a suitable combination thereof. As described above, the auxiliary electrode 270 may serve as a metal by performing an impurity implantation process.

The first insulating layer 280 may be disposed on the buffer layer 100, and the first insulating layer 280 may cover the auxiliary electrode 270. The first insulating layer 280 may be formed using silicon oxide, metal oxide, etc. For example, the metal oxide may include hafnium oxide (HfOx), aluminum oxide (AlOx), zirconium oxide (ZrOx), titanium oxide (TiOx), tantalum oxide (TaOx), etc. These may be used alone or in a suitable combination thereof. In example embodiments, the first insulating layer 280 may be formed as a substantially uniform thickness along a profile of the auxiliary electrode 270. In this case, the first insulating layer 280 may have a relatively thin thickness.

The second insulating layer 290 may be disposed on the first insulating layer 280. The second insulating layer 290 may be formed as a single layer structure. Alternatively, the second insulating layer 290 may be formed as a multi-layer structure including at least two insulating layers. The second insulating layer 290 may be formed using an organic material. For example, the second insulating layer 290 may include a photoresist, an acrylic-based resin, a polyimide-based resin, a polyamide-based resin, a siloxane-based resin. These may be used alone or in a suitable combination thereof. In some example embodiments, the second insulating layer 290 may be formed using an inorganic material such as silicon compounds, metals, metal oxides. For example, the second insulating layer 290 may include silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These may be used alone or in a suitable combination thereof.

The via insulating layer 110 may be disposed on the second insulating layer 290. The via insulating layer 110 may be formed using organic materials or inorganic materials.

The first electrodes 210 may be disposed on the via insulating layer 110 The first electrodes 210 may be formed using materials transmitting or reflecting a light according to a light emitting method of the OLED device. For example, the first electrode 210 may include aluminum (Al), an alloy containing aluminum, aluminum nitride (AlNx), silver (Ag), an alloy containing silver, tungsten (W), tungsten nitride (WNx), copper (Cu), an alloy containing copper, nickel (Ni), chromium (Cr), chromium nitride (CrOx), molybdenum (Mo), an alloy containing molybdenum, titanium (Ti), titanium nitride (TaNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These may be used alone or in a suitable combination thereof. In example embodiments, the first electrode 210 may be formed as a single layer structure or a multilayer structure including a metal film, an alloy film, a metal nitride film, a conductive metal oxide film and/or a transparent conductive material layer. Each sub-pixel region P may include a first-color corresponding sub-pixel electrode, a second-color corresponding sub-pixel electrode, and a third-color corresponding sub-pixel electrode that respectively correspond to a first-color light emitting layer, a second-color light emitting layer, and a third-color light emitting layer and are respectively positioned in the sub-pixels 10, 20, and 30.

The pixel defining layer 230 may disposed on the second insulating layer 290 to expose a portion of the first electrode 210. The pixel defining layer 230 may be formed using organic material, inorganic material, etc. The pixel defining layer 230 may expose the first through third sub-pixels of sub-pixel region P and the transparent window of the transparent region T.

The light emitting layers 200 may be disposed on portions the first electrodes 210 exposed by the pixel defining layer 230. Also, the light emitting layers 200 may extend along a side wall of the pixel defining layer 230. The light emitting layers 200 can be obtained by using a laser transfer process, a printing process, etc. In example embodiments, a light emitting layer 200 may have a multi-layer structure including an organic light emitting layer (EL), a hole injection layer (HIL), a hole transport layer (HTL), an electronic transport layer (ETL), an electronic injection layer (EIL), etc. The EL of light emitting layer 200 may be formed using organic light emitting materials that emit color lights such as a red light, a green light, a blue light according to each of sub-pixels. In some example embodiments, the EL of the light emitting layer 200 may have a structure that emits a white color of light by stacking a plurality of light emitting materials capable of generating different colors of light such as a red light, a green light, a blue light, etc. Each sub-pixel region P may include a first-color light emitting layer, a second-color light emitting layer, and a third-color light emitting layer that are respectively positioned in the sub-pixels 10, 20, and 30.

The second electrode 220 may be disposed on the pixel defining layer 230, the light emitting layer 200, and the second insulating layer 290. The second electrode 220 may include magnesium and silver, etc. The second electrode 220 may be electrically connected to the auxiliary electrode 270 via the contact hole 50 penetrating a portion of the via insulating layer 110, a portion of the second insulating layer 290, and a portion of the first insulating layer 280. In example embodiments, the first electrode 210 may be an anode electrode, and the second electrode 220 may be a cathode electrode. In some example embodiments, the first electrode 210 may be a cathode electrode, and the second electrode 220 may be an anode electrode.

The sealing substrate 90 may be disposed on the second electrode 220. The sealing substrate 90 may include a transparent material, and may protect the OLED device from water and moisture. The sealing substrate 90 may be combined with the substrate 100 by a sealing member (not shown). Alternatively, the sealing substrate 90 may have a multi-layer that an inorganic layer and an organic layer are alternately formed.

Figure 3:
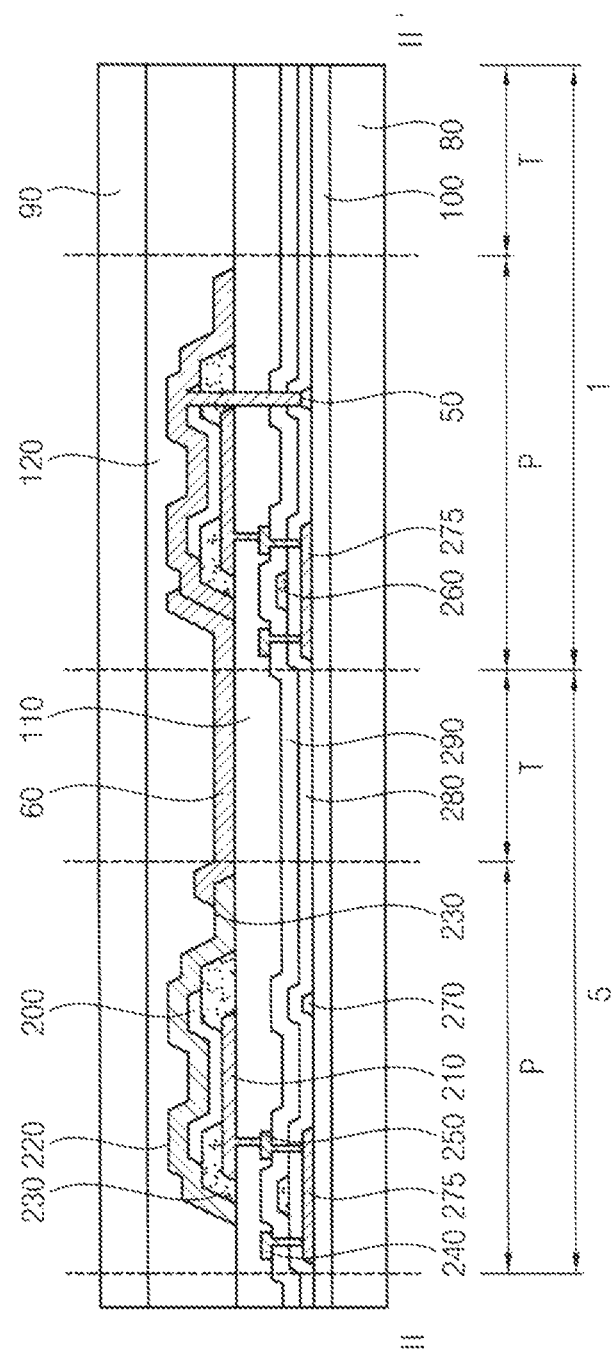
FIG. 3 is a cross-sectional view taken along a line II-II' of FIG. 1.

FIG. 3 is a cross-sectional view taken along a line II-II' of FIG. 1.

Referring to FIGS. 1 through 3, the OLED device may include a substrate 80, a buffer layer 100, an auxiliary electrode 270, an active layer 275, a source electrode 240, a drain electrode 250, a gate electrode 260, a first insulating layer 280, a second insulating layer 290, a contact hole 50, first electrodes 210, a pixel defining layer 230, a light emitting layer 200, second electrodes 220, a bridge electrode 60, and a sealing substrate 90.

As illustrated in FIG. 1, a first pixel region 1 may be disposed adjacent to a fifth pixel region 5 in a second direction that is perpendicular to a first direction. The second electrode 220 disposed in the first pixel 1 may be electrically connected to the second electrode 220 disposed in the fifth pixel 5 through the bridge electrode 60, and the auxiliary electrode 270 may be electrically connected to the second electrode 220 through the contact hole 50.

The active layer 275 and the auxiliary electrode 270 may be disposed on the buffer layer 100. The active layer 275 may be composed of silicon. In some example embodiments, the active layer 275 may be composed of a semiconductor oxide including two-component compound, ternary compound, four-component compound, etc. containing In, Zn, Ga, Sn, Ti, Al, Hf, Zr, Mg, etc. These may be used alone or in a suitable combination thereof. As described above, the auxiliary electrode 275 and source and drain regions of the active layer each may serve as a metal by performing an impurity implantation process.

The source electrode 240 and the drain electrode 250 may be electrically connected to the active layer 275 by removing a portion of the first insulating layer 280 and a portion of the second insulating layer 290.

The gate electrode 260 may be disposed on the first insulating layer 280. The gate electrode 260 may be formed using a metal, alloy, metal nitride, conductive metal oxide, transparent conductive material. For example, the gate electrode 260 may include Al, an alloy containing Al, AlNx, Ag, an alloy containing Ag, W, WNx, Cu, an alloy containing Cu, Ni, Cr, CrOx, Mo, an alloy containing Mo, Ti, TaNx, Pt, Ta, TaNx, Nd, Sc, SRO, ZnOx, ITO, SnOx, InOx, GaOx, IZO, etc. These may be used alone or in a suitable combination thereof. In addition, the gate electrode 260 is a single layer structure or a multi-layer structure including a metal film, an alloy film, a metal nitride film, a conductive metal oxide film and/or a transparent conductive material film.

The OLED device may further include signal lines (not shown). The signal line may be electrically connected to the gate electrode 260. For example, the gate electrode 260 of the TFT may be electrically connected to at least one (e.g., a scan line) among the scan lines. The OLED device includes the TFT of a top gate method, but the OLED device may further include the TFT of a bottom gate method.

The first electrode 210 may be electrically connected to the drain electrode 250 through the contact hole penetrating the via insulating layer 110, and the second electrode 220 may be electrically connected to the auxiliary electrode 270 through the contact hole 50 penetrating the pixel defining layer 230, the via insulating layer 110, the second insulating layer 290, and the first insulating layer 280. In example embodiments, the first electrode 210 may be an anode electrode, and the second electrode 220 may be a cathode electrode. In example embodiments, the first electrode 210 may be a cathode electrode, and the second electrode 220 may be an anode electrode.

The bridge electrode 60 may be disposed in a portion of the transparent region T. The second electrode 220 disposed in the first pixel region 1 may be connected to the second electrode 220 disposed in the fifth pixel region 5 through the bridge electrode 60. In addition, since the bridge electrode 60 may be disposed in a portion of the transparent region T, a transmittance of the OLED device may be relatively improved.

FIG. 4 through FIG. 9 are cross-sectional views for describing a method of manufacturing a transparent organic light emitting display according to example embodiments.

Figure 4:
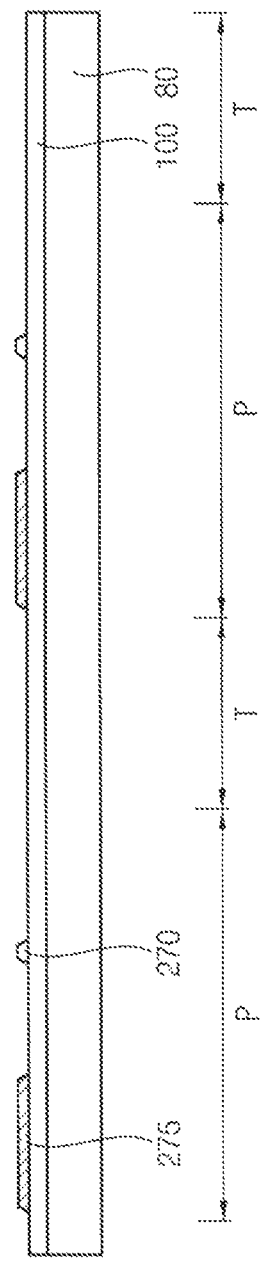
FIG. 4, FIG. 5, FIG. 6, FIG. 7, FIG. 8, and FIG. 9 are cross-sectional views for describing a method of manufacturing an organic light emitting display according to example embodiments.

Referring to FIG. 4 a buffer layer 100 may be formed on a substrate 80. The substrate 80 may be formed using a transparent polymer resin such as a polyimide-based resin. A portion of the substrate 80 may be defined as a sub-pixel region P, and a remaining portion of the substrate 80 may be defined as a transparent region T.

An active layer 275 may be formed on the sub-pixel region P, and an auxiliary electrode 270 and the active layer 275 may be formed at the same level. For example, after a semiconductor layer (not shown) is formed on the entire buffer layer 100, a preliminary active layer (not shown) may be formed by patterning the semiconductor layer on the buffer layer 100. Subsequently, a crystallization process may be performed on the preliminary active layer to form the active layer 275, and then the active layer 275 may be formed on the buffer layer 100. Here, the semiconductor layer may be formed by using a chemical vapor deposition process, a plasma enhanced chemical vapor deposition, a low pressure chemical vapor deposition process, a sputtering process, or the like. When the semiconductor layer includes amorphous silicon, the active layer 275 may be composed of polysilicon. Also, a crystallization process to obtain the active layer 275 from the preliminary active layer may include a laser exposure process, a heat treatment process, and a heat treatment process using a catalyst. In example embodiments, after the semiconductor layer may be formed, the dehydrogenation process may be performed on the semiconductor layer. As the dehydrogenation process is perfumed, a concentration of hydrogen atoms in the semiconductor layer It may be decreased. As a result, electrical characteristics of the active layer 275 may be improved.

An impurity may be doped in a portion of the active layer 275 and the auxiliary electrode 270 each, and an electrical conductivity of the portion of the active layer 275 and the auxiliary electrode 270 each may be higher than a remaining portion of the active layer 275. For example, the portion of the active layer 275 may be source and drain regions.

Figure 5:
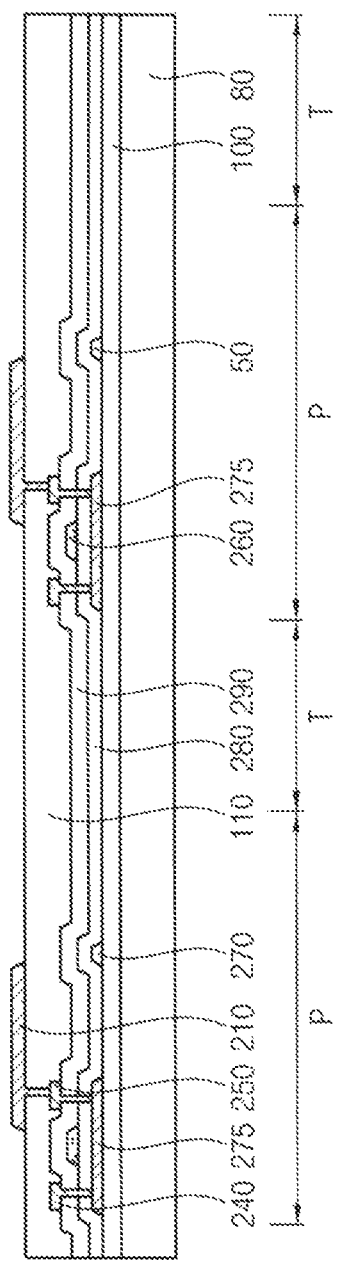

Referring to FIG. 5, the first insulating layer 280 may be formed on a buffer layer 100 to cover the active layer 275 and the auxiliary electrode 270. The auxiliary electrode 270 and the active layer 275 may be disposed at the same level, and the auxiliary electrode 270 and the active layer 275 may be simultaneously formed using the same material. The first insulating layer 280 may be obtained using a chemical vapor deposition process, a spin coating process, a plasma enhanced chemical vapor deposition process, a sputtering process, a vacuum deposition process, a high-density plasma-chemical vapor deposition process, a printing process, or the like.

A gate electrode 260 may be formed on the first insulating layer 280. A second insulating layer 290 may be formed on the first insulating layer 280 to cover the gate electrode 260. The second insulating layer 290 may be obtained using a chemical vapor deposition process, a spin coating process, a plasma enhanced chemical vapor deposition process, a sputtering process, a vacuum deposition process, a high-density plasma-chemical vapor deposition process, a printing process, or the like.

A source electrode 240 and a drain electrode 250 may be formed on the second insulating layer 280. Each of the source electrode 240 and the drain electrode 250 may be electrically connected to the active layer 275 by penetrating the first insulating layer 280 and second insulating layer 290. In particular, after each of contact holes exposing each of the source and drain regions of the active layer 275 is formed, a conductive layer may be disposed on the entire second insulting layer 280 such that the conductive layer fills the contact holes. The conductive layer may be patterned through an etching process to form the source electrode 240 and the drain electrode 250 after the conductive layer is disposed on the entire second insulting layer 280. The conductive layer may be formed using a metal, metal nitride, or an alloy.

A via insulating layer 110 may be formed, and the via insulating layer 110 may cover the second insulating layer 290, the source electrode 240 and the drain electrode 250. The via insulating layer 110 may have a substantially flat upper surface as shown in FIG. 5. The via insulating layer 110 may be formed using the organic material (e.g., polyimide, an epoxy-based resin, an acrylic-based resin, polyester, etc.) through a spin coating process or a slit coating process. A via hole may be formed by partially etching the via insulating layer 110. An upper surface of the drain electrode 250 may be exposed by the via hole. A first electrode 210 that is electrically connected to the drain electrode 250 may be formed on the via insulating layer to fill the via hole of the via insulating layer 110.

Figure 6:
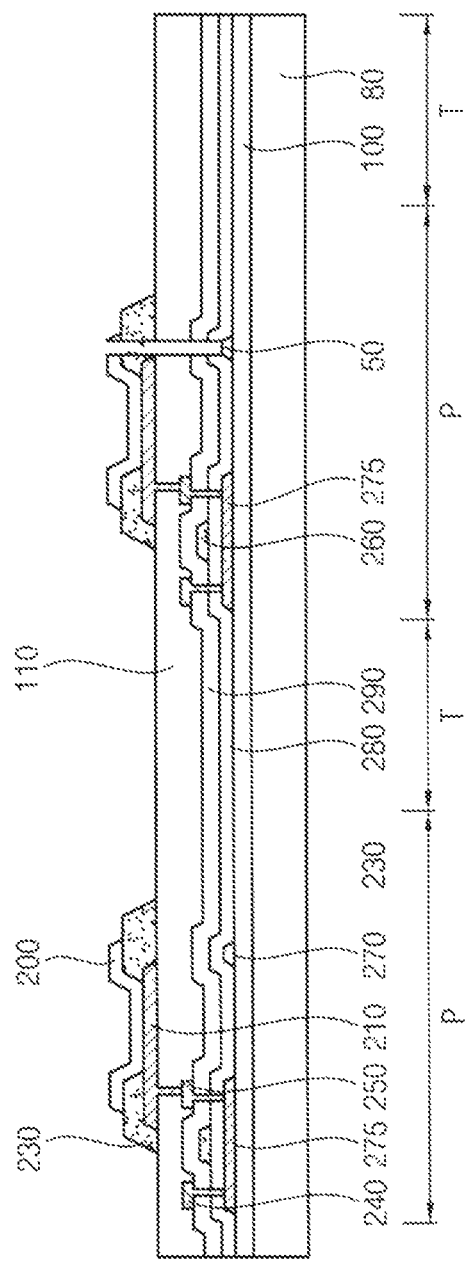

Referring to FIG. 6, a pixel defining layer 230 is formed in the sub-pixel region P on the via insulating layer 110, and the pixel defining layer 230 may expose a portion of the first electrode 210. The pixel defining layer 230 may be formed through an exposure and a development processes after photosensitive organic materials (e.g., polyimide resin, acrylic resin, etc.) are laminated on the via insulating layer 110.

A light emitting layer 200 is formed on the first electrode 210 exposed by the pixel defining layer 230. For example, the light emitting layer 200 may be formed through a spin coating process, a roll printing process, a nozzle printing process, an ink-jet printing process, etc. using a fine metal mask (FMM) including openings exposing a region in which a plurality of sub-pixel is formed. Accordingly, the light emitting layer 200 including an organic light emitting material may be formed.

A contact hole 50 may be formed. The contact hole 50 may expose an upper surface of auxiliary electrode 270 by removing a portion of the pixel defining layer 230, the via insulating layer 110, the first insulating layer 280 and the second insulating layer 290. For example, the contact hole 50 may be located adjacent to a first sub-pixel 10 of the first pixel region 1, and may be formed using a laser drilling process.

Figure 7:
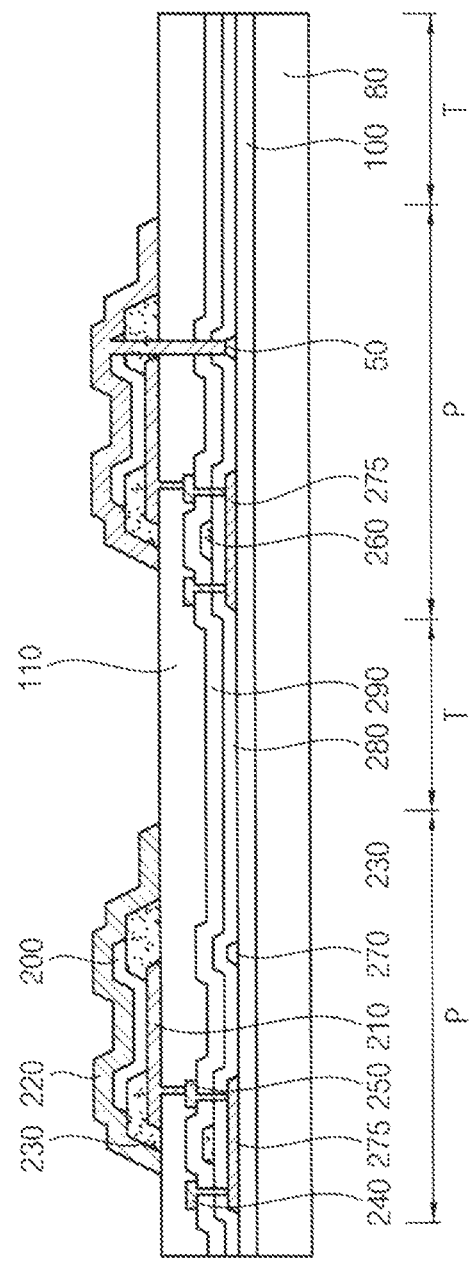

Referring to FIG. 7, a second electrode 220 may be formed, and the second electrode may be disposed in the sub-pixel region P on the light emitting layer 200, the pixel defining layer 230 and the via insulating layer 110. The second electrode 220 may be electrically connected to the auxiliary electrode 270 through a contact hole 50. The second electrode 220 may be formed through a spin coating, a roll printing process, a nozzle printing process, an ink jet printing process, etc. using the FMM.

Figure 8:
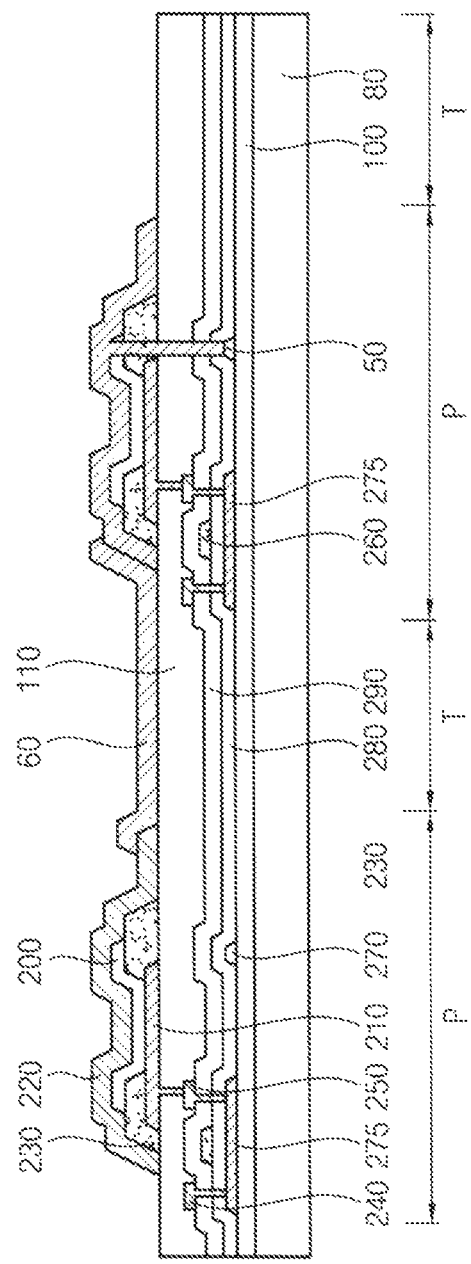

Referring to FIG. 8, a bridge electrode 60 that is disposed in a portion of at least two adjacent the transparent regions T among the transparent regions T in a first direction may be electrically connected to the second electrodes 220 (e.g., the second electrodes 220 is adjacent to each other in a second direction that is perpendicular to the first direction) that are adjacent to the at least two adjacent the transparent regions T among the transparent regions T in the first direction. Since the bridge electrode 60 is disposed in a portion of at least two adjacent the transparent regions T among the transparent regions T in the first direction, a transmittance of the OLED device may be relatively increased. The bridge electrode 60 may be formed through a spin coating, a roll printing process, a nozzle printing process, an ink jet printing process, etc. using the FMM.

Figure 9:
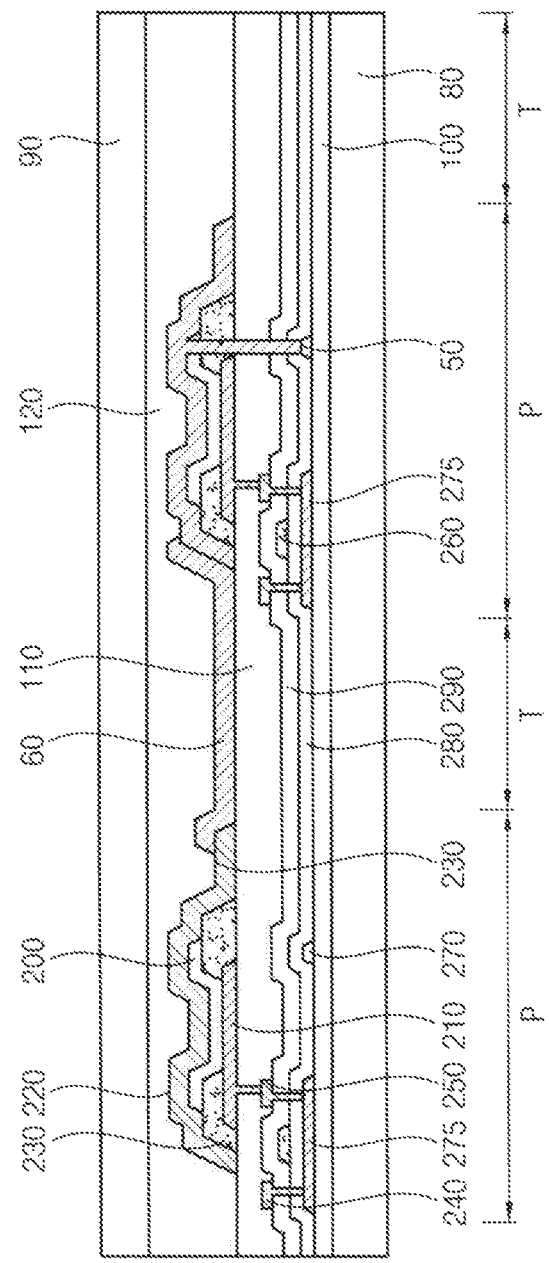

Referring to FIG. 9, a sealing substrate 90 may be formed on the second electrode 220 and the bridge electrode 60. The substrate 80 and the sealing substrate 90 may protect the sub-pixels from the outside (e.g., the moisture or the water). The sealing substrate 90 includes a transparent material. The sealing substrate 90 may be bonded to the substrate 80 by a sealing member (e.g., a sealant), and the space between the substrate 80 and the sealing substrate 90 may be sealed.

FIGS. 10 through 16 are plan views for describing a forming sequence of second electrodes and bridges electrodes.

Figure 10:
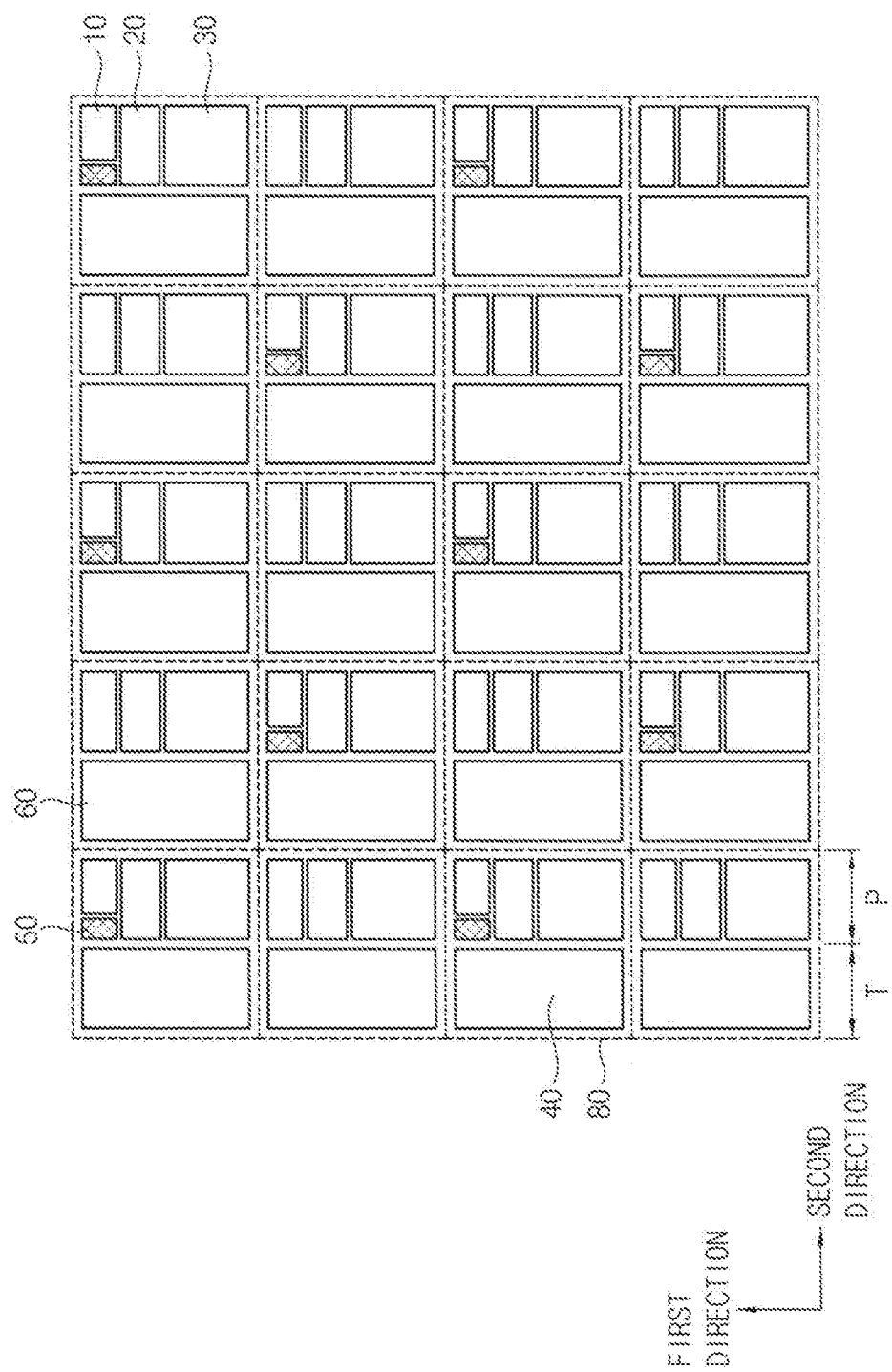
FIG. 10, FIG. 11, FIG. 12, FIG. 13, FIG. 14, FIG. 15, and FIG. 16 are plan views for describing a sequence of forming second-type electrodes (or second electrodes for conciseness) and bridge electrodes according to example embodiments.
Figure 11:
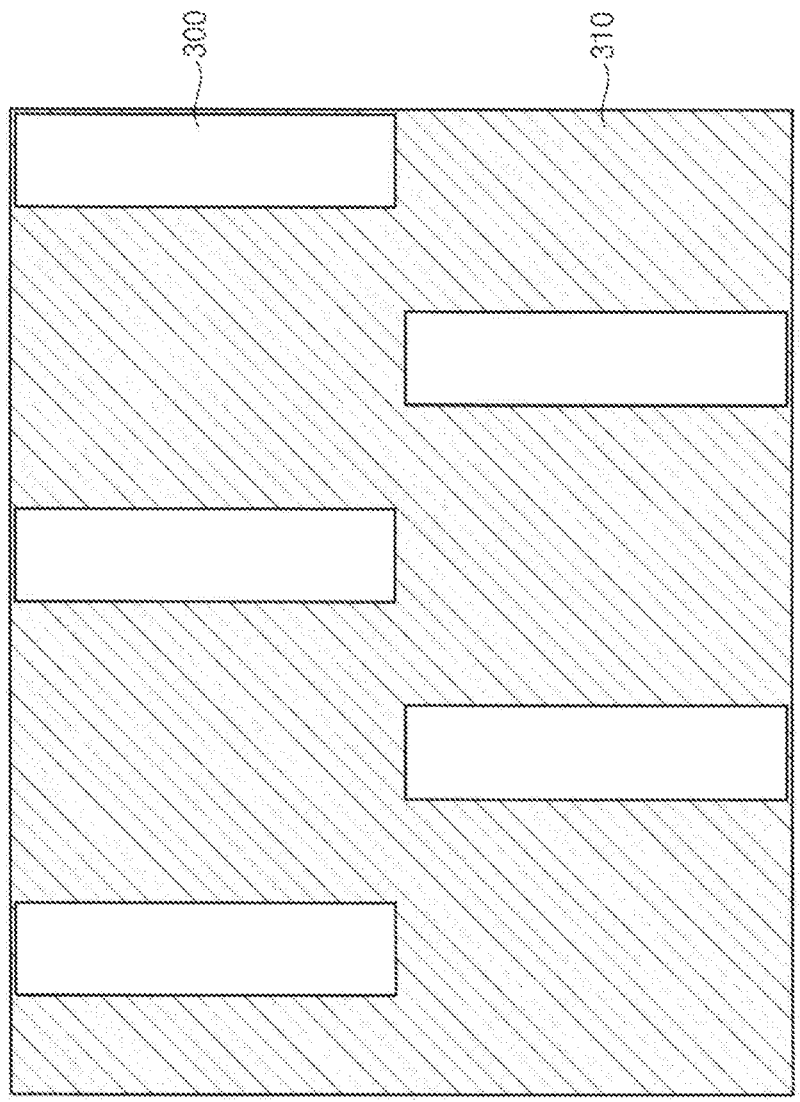
Figure 12:
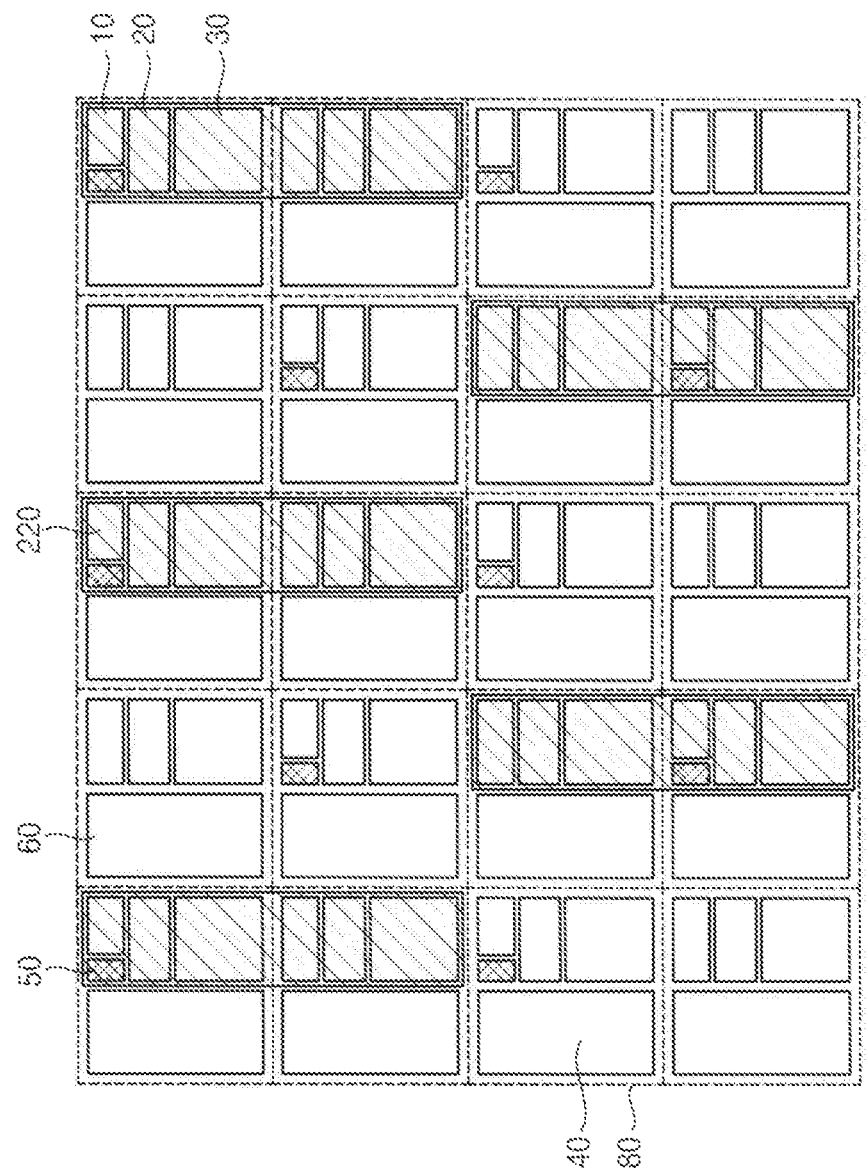
Figure 13:
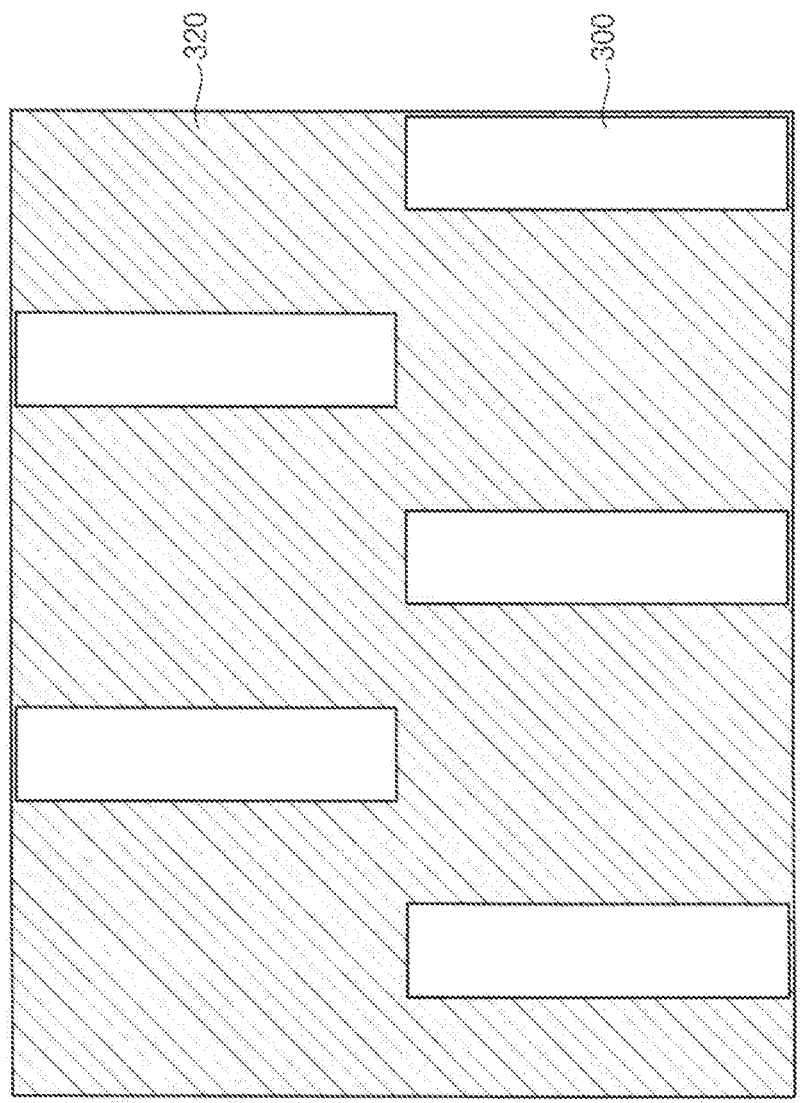
Figure 14:
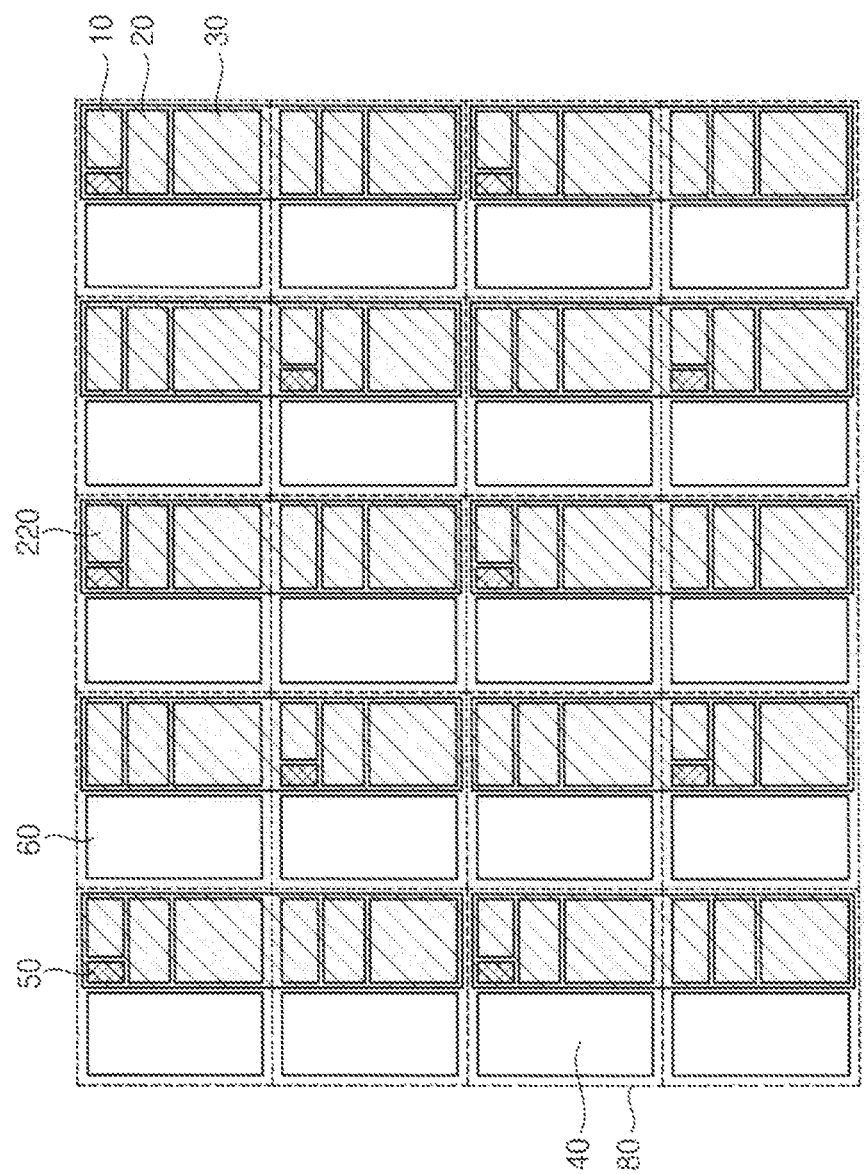
Figure 15:
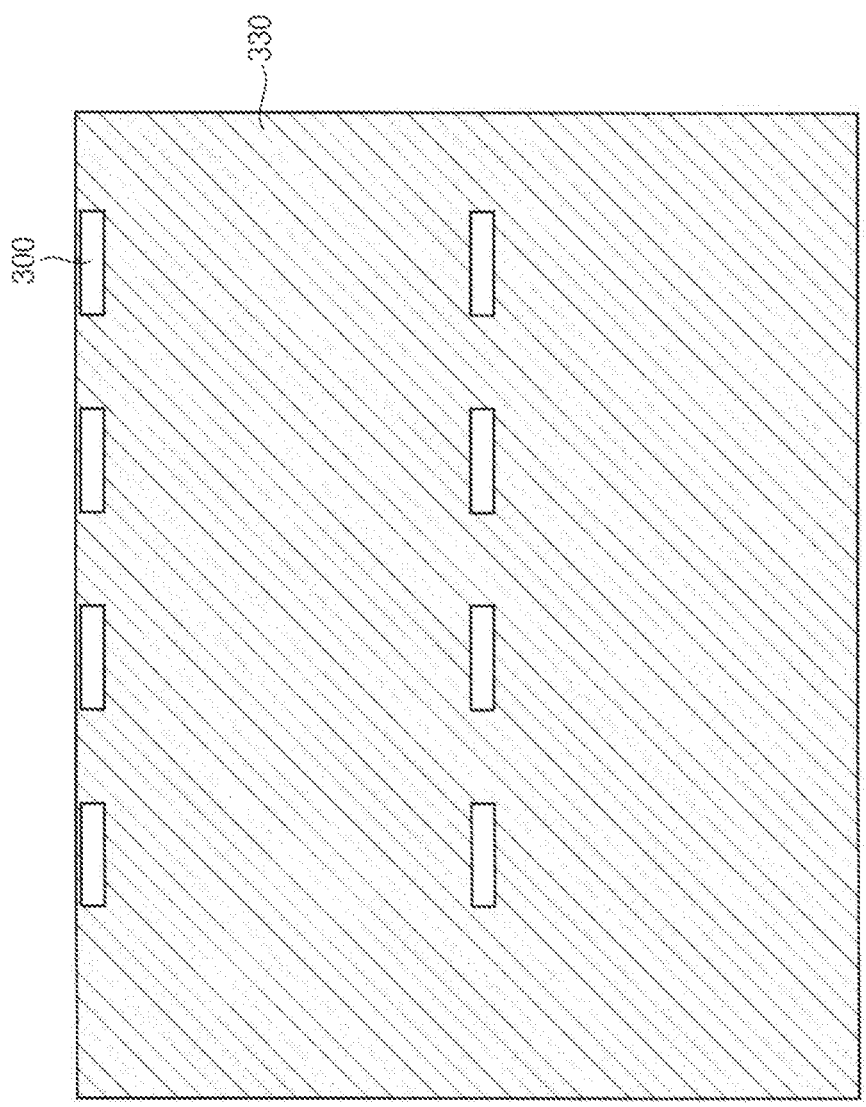
Figure 16:
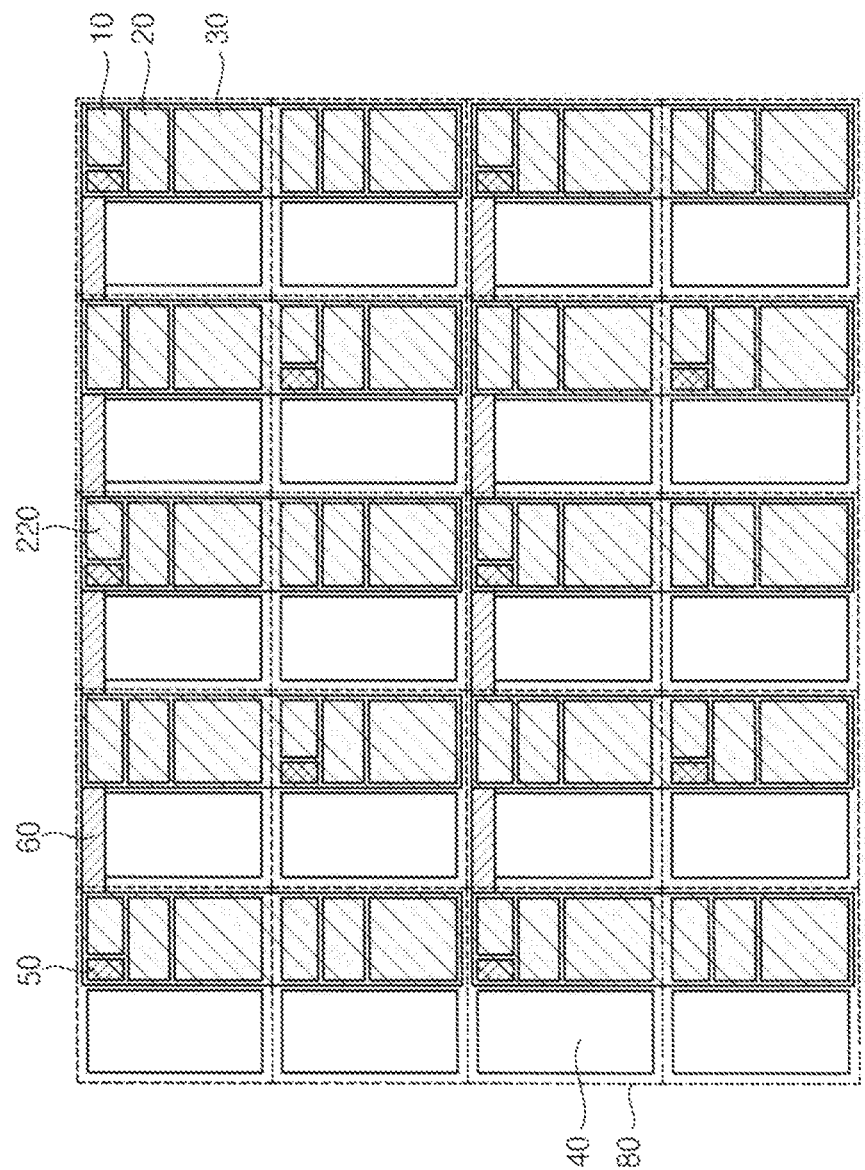

FIG. 10 illustrates a position of each of contact holes 50 on a substrate when adjacent two sub-pixel regions P among sub-pixel regions P in a first direction are grouped. FIG. 11 illustrates a first FMM 310, and FIG. 12 illustrates a position of each of second electrodes 220 disposed on the substrate of FIG. 10 by using the first FMM 310. FIG. 13 illustrates a second FMM 320, and FIG. 14 illustrates a position of each of second electrodes 220 disposed on the substrate of FIG. 12 by using the second FMM 320. FIG. 15 illustrates a third FMM 330, and FIG. 16 illustrates a position of each of bridge electrodes 60 disposed on the substrate of FIG. 14 by using the third FMM 330.

Referring to FIG. 10, pixel regions may be arranged in (4)th rows and (5)th columns on a substrate.

In example embodiments, a method of manufacturing a OLED device may include providing a substrate, forming a semiconductor device and an auxiliary electrode, forming a first electrode, forming a pixel definition and a light emitting layer, forming a second electrode and the bridge electrode, as described in FIGS. 4 through 8.

When the adjacent two sub-pixel regions P among the sub-pixel regions P in the first direction are grouped, the grouped sub-pixel region P may include the sub-pixel regions P that are located at a (K)th row and a (K+1)th row among first through (M)th rows in the same column, where K is an odd number that is more than 1 and not more than M−1, and where M is an integer greater than 1.

A contact hole 50 may be formed in at least one among the grouped sub-pixel regions P. The contact holes 50 may be repeatedly located in the grouped sub-pixel region P that is located at a (J)th column or a (J+1)th column among the first through (N)th columns (where, J is an odd number that is more than 1 and not more than N−1, and N is an integer greater than 1) in the same row, and the contact holes 50 may be arranged in a zigzag pattern. For example, the contact holes 50 may located in the sub-pixel regions of (1)st row and (1)st column, (3)rd row and (1)st column, (2)nd row and (2)nd column, (4)th row and (2)nd column, etc.

An IR-drop capable of being generated in the OLED device may be relatively decreased, and a stain capable of being generated in a display image of the OLED device may be prevented.

For example, when the contact holes are formed in even or odd rows or are formed in even or odd columns, a voltage level of the lines (e.g., the rows or the column) where the contact holes are located may be different from a voltage level of the lines where the contact holes are not located, the contact holes may be arranged in paralleled to each other. In this case, a stain in a display image of the OLED device may occur. In example embodiments, as the contact holes 50 are disposed in the zigzag pattern, a voltage that is applied to an auxiliary electrode may be uniformly provided to the second electrode 220 through the contact holes 50.

After the contact holes 50 are formed, the second electrodes 220 may be disposed on a light emitting layer by using the FMMs of FIGS. 11 and 13. The second electrodes 220 may be electrically connected to the auxiliary electrode through the contact holes 50.

Referring to FIGS. 11, 12, 13, and 14, openings 300 of the FMMs 310 and 320 are not continuously formed in rows or columns. For example, because the FMMs are thin metal masks, the FMMs may be bent (or curved) when the openings are continuously formed in rows or columns. In this case, the second electrodes may not be formed in an exact location.

As illustrated in FIG. 12, the second electrode 220 may be disposed on a portion of the substrate by using the FMM 310. As illustrated in FIG. 14, the second electrode may be disposed on a remaining portion of the substrate by using the FMM 320. Accordingly, the second electrode 220 may be disposed in the entire sub-pixel region P.

As illustrated in FIG. 14, each of the grouped second electrodes 220 may have an island shape. The grouped second electrodes 220 that are located in a (j)th column among first through (N)th columns may not be electrically connected to the grouped second electrodes 220 that are located in a (j+1)th column among the first through (N)th columns (where, J is an odd number that is more than 1 and not more than N−1, and N is an integer greater than 1).

As illustrated in FIG. 16, the bridge electrodes 60 may be disposed on the substrate by using a FMM 330 of FIG. 15.

Since the bridge electrode 60 is disposed in a portion of adjacent two transparent regions T among the transparent regions T in the first direction, a transmittance of the OLED device may be relatively increased. In addition, the number of the bridge electrode 60 may be minimized within a range capable of compensating the IR drop. When the number of the bridge electrode 60 is decreased, a manufacturing process may be simplified, and a manufacturing cost may be decreased. Also, a transmittance of the OLED device may be increased. But, when the number of the bridge electrode 60 is not enough, a voltage unbalance of the OLED device may occur. Therefore, the number of the bridge electrode 60 may be determined by considering the number of the contact hole 50.

FIGS. 17 through 20 are plan views for describing a forming sequence of second electrodes and bridge electrodes.

Figure 17:
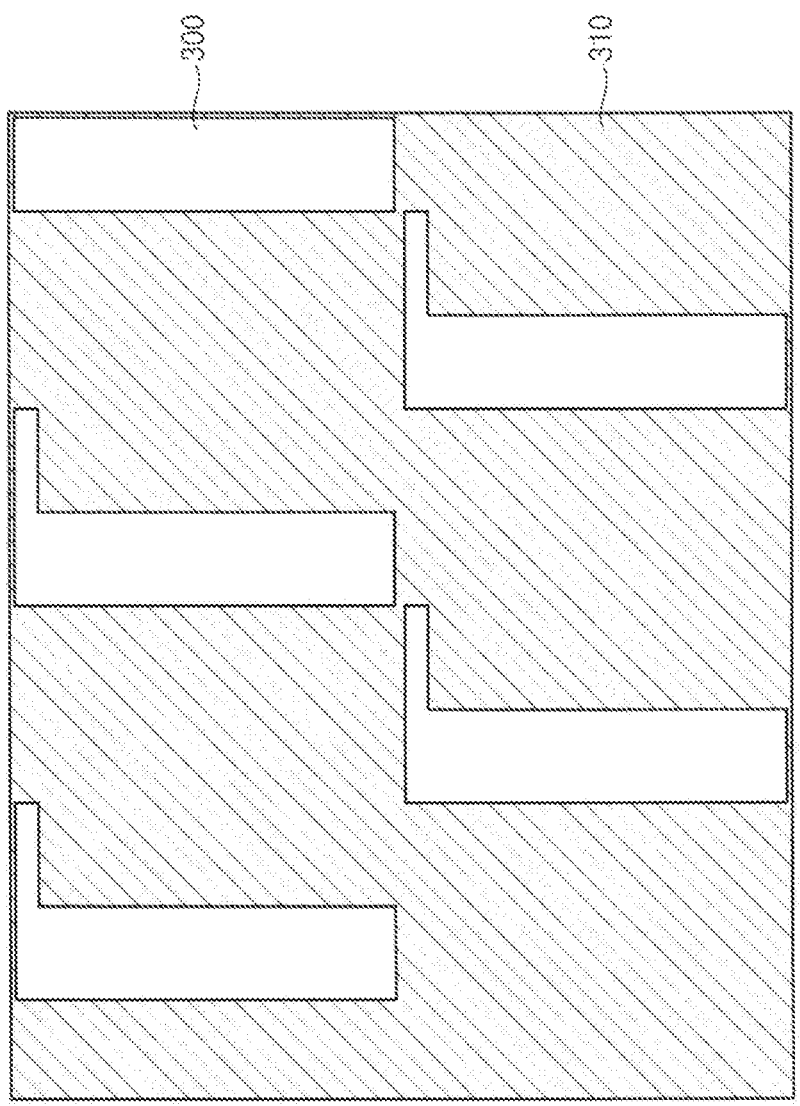
Figure 18:
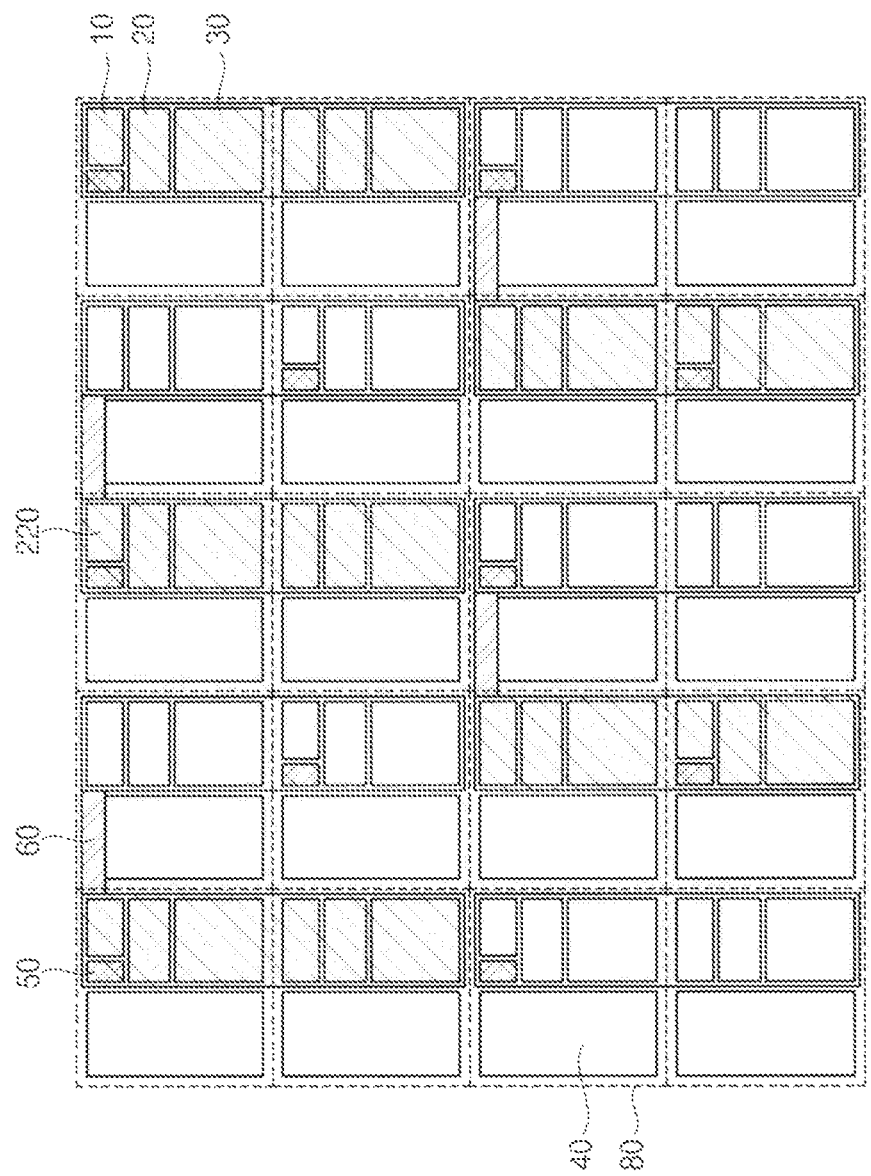

FIG. 17 illustrates a fourth FMMI 310, and FIG. 18 illustrates a position of each of second and bridge electrodes disposed on the substrate FIG. 10 by using the fourth FMM 310.

Figure 19:
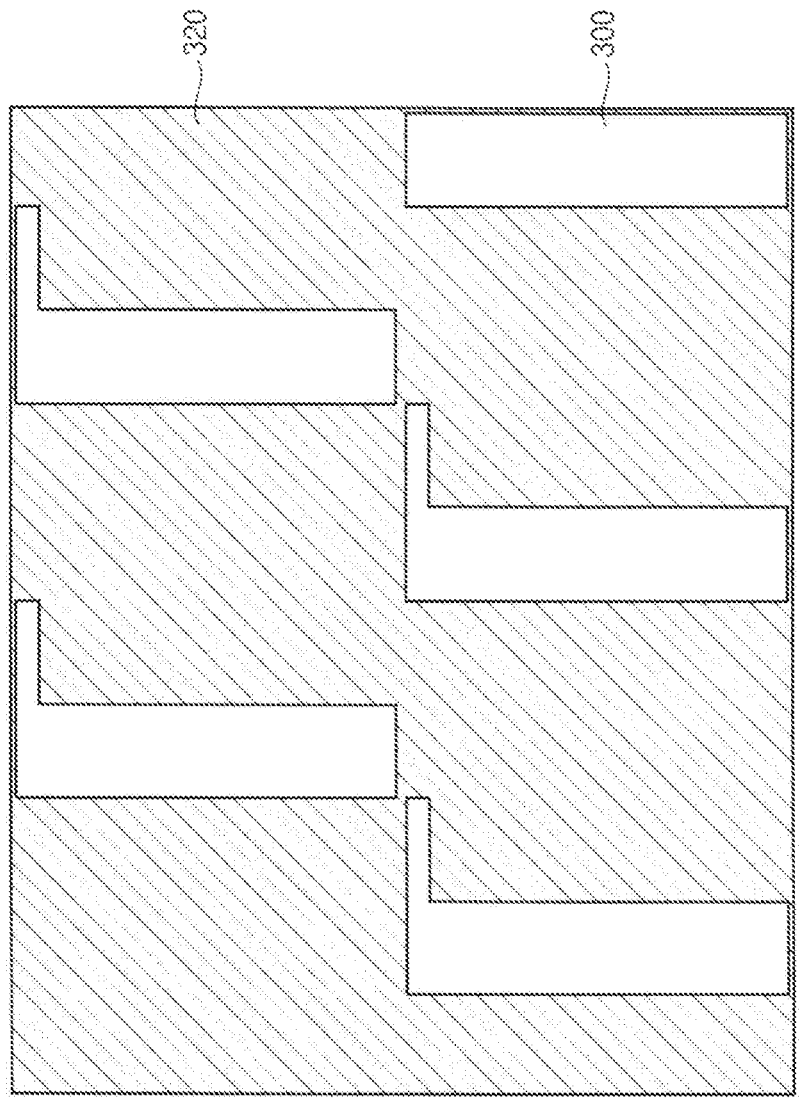

FIG. 19 illustrates a fifth FMM 320, and FIG. 20 illustrates a position of each of second and bridge electrodes disposed on the substrate of FIG. 18 by using the fifth FMM 320.

The FMM 310 and 320 may include an opening 300, and the second electrode 220 and the bridge electrode 60 may be simultaneously formed by using the FMM 310 and 320. A OLED device of FIG. 20 may be manufactured after the second electrode 220 and the bridge electrode 60 may be simultaneously formed by using the FMM 310 and 320. The OLED device of FIG. 20 may be substantially the same as a OLED device of FIG. 16.

Figure 21A:
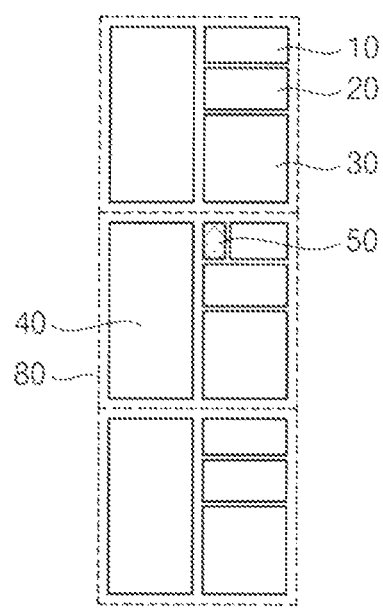
FIG. 21A and FIG. 21B are plan views illustrating configurations (or method) of grouping three sub-pixel regions according to example embodiments.
Figure 21B:
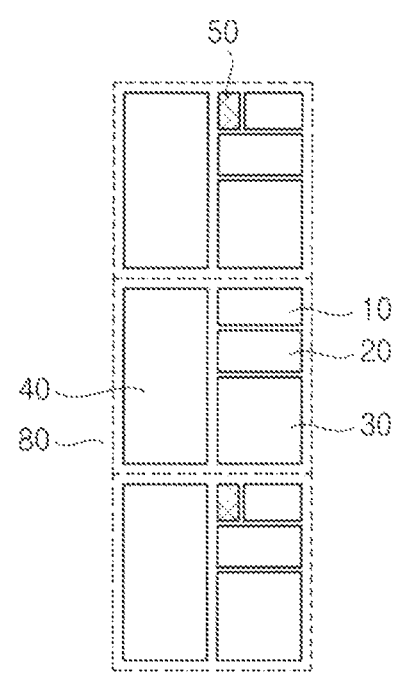
Figure 22A:
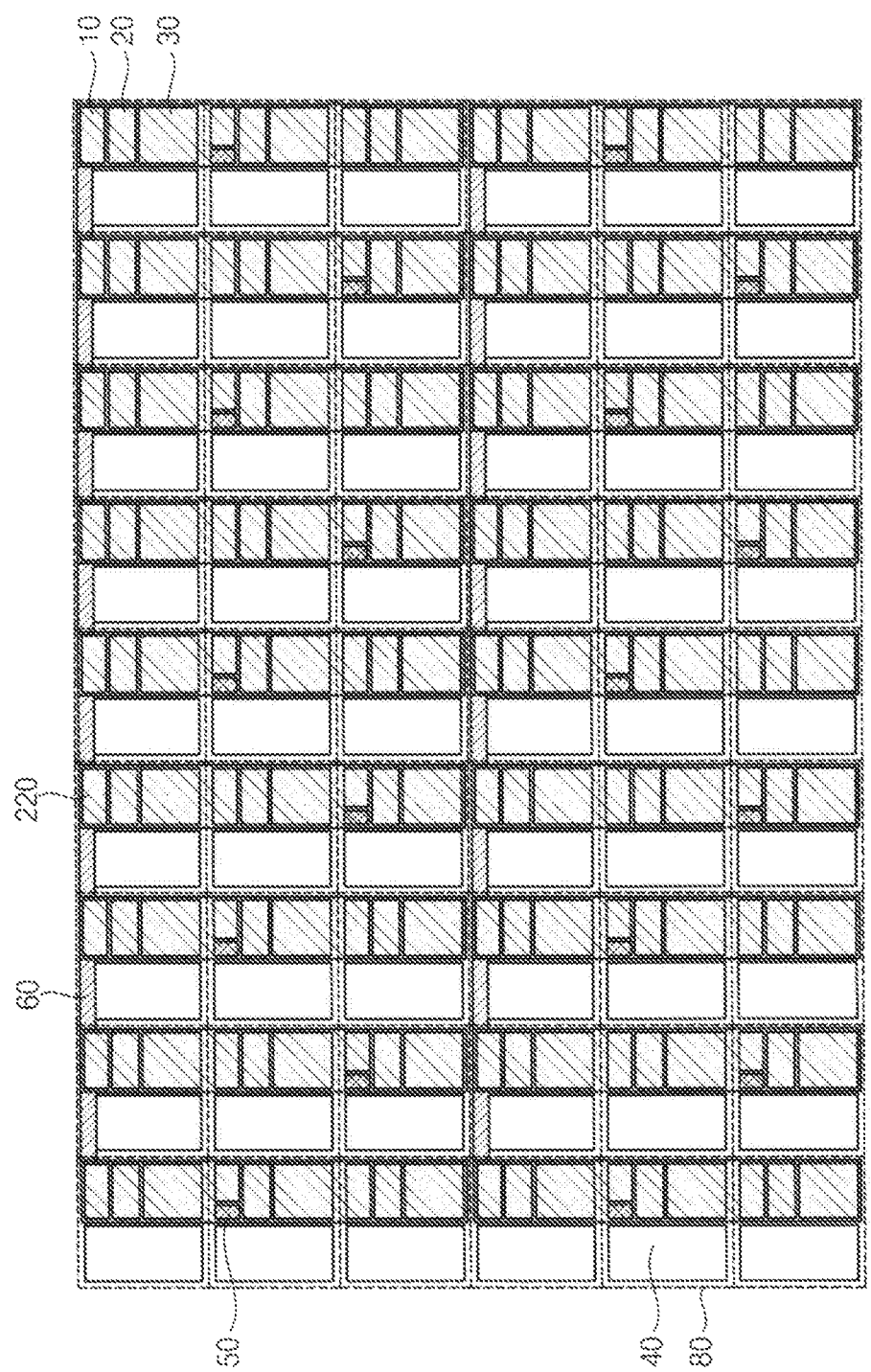

FIG. 21A and FIG. 21B are plan views illustrating two configurations (or methods) of grouping three sub-pixel regions, and FIG. 22A and FIG. 22B are plan views for describing second electrodes and bridge electrodes of FIG. 21A and FIG. 21B, respectively.

Referring to FIGS. 21A, 21B, 22A, and 22B, when three pixel regions are grouped in a group, a contact hole 50 may be formed in the group in a manner illustrated in FIG. 21A, or two contact holes 50 may be formed in the group in a manner illustrated in FIG. 21B. A position of the contact holes 50 may be determined such that a distribution of a voltage applied to the second electrode 220 is uniform. One contact hole 50 is formed in each pixel group a that consists of three pixel regions in an OLED device illustrated in FIG. 22A. Two contact holes 50 are formed in each pixel group b that consists of three pixel regions in an OLED device illustrated in FIG. 22B.

Embodiments may be applied to various display devices that include organic light emitting display devices. For example, embodiments may be applied to mobile phones, smartphones, smart pads, laptop computers, tablet computers, personal digital assistants (PDAs), portable multimedia players (PMPs), digital cameras, music players (e.g., a MP3 player), portable game consoles, navigation devices, vehicle display devices, ship display devices, aircraft display devices, portable communication devices, medical display devices, etc.

The foregoing is illustrative of example embodiments and is not to be construed as limiting. Although a few example embodiments have been described, those skilled in the art will readily appreciate that many modifications are possible in the example embodiments All such modifications are intended to be included within the scope defined in the claims.

What is claimed is:

1. An organic light emitting display device comprising:
   a first auxiliary electrode;
   a first first-group first-color corresponding electrode;
   a second first-group first-color corresponding electrode, which is electrically isolated from and larger than the first first-group first-color corresponding electrode; and a first group electrode, which overlaps both the first first-group first-color corresponding electrode and the second first-group first-color corresponding electrode, wherein a first portion of the first group electrode directly contacts the first auxiliary electrode and is positioned closer to the first first-group first-color corresponding electrode than to the second first-group first-color corresponding electrode.

2. The organic light emitting display device of claim 1 comprising a substrate, which overlaps the first auxiliary electrode,
wherein a first edge of the first first-group first-color corresponding electrode is aligned with a first edge of the second first-group first-color corresponding electrode in a first direction, and
wherein the first portion of the first group electrode is positioned between the first first-group first-color corresponding electrode and a first transparent portion of the substrate in a second direction in a plan view of the organic light emitting display device.

3. The organic light emitting display device of claim 1, wherein a first edge of the first first-group first-color corresponding electrode is aligned with a first edge of the second first-group first-color corresponding electrode in a first direction, and
wherein the first first-group first-color corresponding electrode is shorter than the second first-group first-color corresponding electrode in a second direction in a plan view of the organic light emitting display device.

4. The organic light emitting display device of claim 1 comprising:
a first second-group first-color corresponding electrode;
a second second-group first-color corresponding electrode, which is larger than the first second-group first-color corresponding electrode; and
a second group electrode, which is insulated from the first group electrode and overlaps both the first second-group first-color corresponding electrode and the second second-group first-color corresponding electrode, wherein a first portion of the second group electrode directly contacts the first auxiliary electrode and is positioned closer to the first second-group first-color corresponding electrode than to the second second-group first-color corresponding electrode.

5. The organic light emitting display device of claim 4, wherein the first second-group first-color corresponding electrode is as large as the first first-group first-color corresponding electrode, and
wherein the second second-group first-color corresponding electrode is as large as the second first-group first-color corresponding electrode.

6. The organic light emitting display device of claim 4, wherein the second first-group first-color corresponding electrode is positioned between the first portion of the first group electrode and the first portion of the second group electrode in a first direction in a plan view of the organic light emitting display device, and
wherein the second first-group first-color corresponding electrode and the first second-group first-color corresponding electrode are positioned between the first first-group first-color corresponding electrode and the second second-group first-color corresponding electrode in the first direction in the plan view of the organic light emitting display device.

7. The organic light emitting display device of claim 4 comprising:

a third first-group first-color corresponding electrode, which is larger than the first first-group first-color corresponding electrode and overlaps the first group electrode,
wherein the first first-group first-color corresponding electrode is positioned between the third first-group first-color corresponding electrode and the second first-group first-color corresponding electrode, and
wherein the first first-group first-color corresponding electrode, the second first-group first-color corresponding electrode, and the second second-group first-color corresponding electrode are positioned between the third first-group first-color corresponding electrode and the first second-group first-color corresponding electrode.

8. The organic light emitting display device of claim 4 comprising:
a third first-group first-color corresponding electrode, which is smaller than the second first-group first-color corresponding electrode and overlaps the first group electrode,
wherein the second first-group first-color corresponding electrode is positioned between the third first-group first-color corresponding electrode and the first first-group first-color corresponding electrode, and
wherein the first first-group first-color corresponding electrode, the second first-group first-color corresponding electrode, and the first second-group first-color corresponding electrode are positioned between the third first-group first-color corresponding electrode and the second second-group first-color corresponding electrode.

9. The organic light emitting display device of claim 8, wherein a second portion of the first group electrode directly contacts the first auxiliary electrode and is positioned closer to the third first-group first-color corresponding electrode than to the second first-group first-color corresponding electrode, and
wherein the first portion of the first group electrode is positioned between the second portion of the first group electrode and the first portion of the second group electrode.

10. The organic light emitting display device of claim 4 comprising:
a second auxiliary electrode, which extends parallel to the first auxiliary electrode;
a first third-group first-color corresponding electrode;
a second third-group first-color corresponding electrode, which is shorter than the first third-group first-color corresponding electrode;
a third group electrode, which overlaps both the first third-group first-color corresponding electrode and the second third-group first-color corresponding electrode, wherein a first portion of the third group electrode directly contacts the second auxiliary electrode and is positioned closer to the second third-group first-color corresponding electrode than to the first third-group first-color corresponding electrode; and
a bridge electrode, which is shorter than the first third-group first-color electrode in a first direction, wherein a first end of the bridge electrode directly contacts the first group electrode, and wherein a second end of the bridge electrode directly contacts the third group electrode.

11. The organic light emitting display device of claim 10, wherein a second direction is perpendicular to the first direction, and wherein no portion of the first group electrode that directly contacts the first auxiliary electrode is aligned with the first portion of the third group electrode in the second direction in a plan view of the organic light emitting display device.

12. The organic light emitting display device of claim 10, wherein a second direction is perpendicular to the first direction,
wherein the bridge electrode is positioned between the first first-group first-color corresponding electrode or the second first-group first-color corresponding electrode and the first third-group first-color corresponding electrode or the second third-group first-color corresponding electrode in the second direction in a plan view of the organic light emitting display device, and
wherein the first first-group first-color corresponding electrode is positioned between the first portion of the first group electrode and the bridge electrode in the second direction in the plan view of the organic light emitting display device.

13. The organic light emitting display device of claim 12, wherein the bridge electrode is positioned between first first-group first-color corresponding electrode and the first third-group first-color corresponding electrode or the second third-group first-color corresponding electrode in the second direction in the plan view of the organic light emitting display device, and
wherein no bridge electrode is aligned with the second first-group first-color corresponding electrode in the second direction in the plan view of the organic light emitting display device and directly contacts both the first auxiliary electrode and the second auxiliary electrode.

14. The organic light emitting display device of claim 13, wherein an edge of the bridge electrode is aligned with each of the first first-group first-color corresponding electrode and the first portion of the first group electrode in the second direction in the plan view of the organic light emitting display device.

15. The organic light emitting display device of claim 14, wherein the edge of the bridge electrode is aligned with the second third-group first-color corresponding electrode in the second direction in the plan view of the organic light emitting display device.

16. The organic light emitting display device of claim 12, wherein the bridge electrode is positioned between second first-group first-color corresponding electrode and the first third-group first-color corresponding electrode or the second third-group first-color corresponding electrode in the second direction in the plan view of the organic light emitting display device, and
wherein no bridge electrode is aligned with the first first-group first-color corresponding electrode in the second direction in the plan view of the organic light emitting display device and directly contacts both the first auxiliary electrode and the second auxiliary electrode.

17. The organic light emitting display device of claim 16, wherein an edge of the bridge electrode is aligned with each of the second first-group first-color corresponding electrode and the second third-group first-color corresponding electrode in the second direction in the plan view of the organic light emitting display device.

18. The organic light emitting display device of claim 12 comprising:
a first first-group second-color corresponding electrode, which is longer than the first first-group first-color corresponding electrode in the second direction; and
a second first-group second-color corresponding electrode, which is longer than the first first-group first-color corresponding electrode in the second direction,
wherein no bridge electrode is aligned with either of the first first-group second-color corresponding electrode and the second first-group second-color corresponding electrode in the second direction and directly contacts both the first auxiliary electrode and the second auxiliary electrode.

19. The organic light emitting display device of claim 18 comprising:
a first first-group third-color corresponding electrode, which is longer than the first first-group first-color corresponding electrode in the second direction; and
a second first-group third-color corresponding electrode, which is longer than the first first-group first-color corresponding electrode in the second direction,
wherein not any bridge electrode is aligned with either of the first first-group third-color corresponding electrode and the second first-group third-color corresponding electrode in the second direction and directly contacts both the first auxiliary electrode and the second auxiliary electrode.

20. An organic light emitting display device comprising:
a first auxiliary electrode;
a first first-group first-color corresponding electrode on the first auxiliary electrode;
a second first-group first-color corresponding electrode at the same level with the first first-group first-color corresponding electrode;
a first group electrode, which overlaps both the first first-group first-color corresponding electrode and the second first-group first-color corresponding electrode,
wherein a first portion of the first group electrode electrically contacts the first auxiliary electrode and is positioned adjacent to the first first-group first-color corresponding electrode or the second first-group first-color corresponding electrode;
a first second-group first-color corresponding electrode spaced apart from the first and second first-group first color corresponding electrodes on the first auxiliary electrode;
a second second-group first-color corresponding electrode at the same level with the first first-group first-color corresponding electrode; and
a second group electrode, which is insulated from the first group electrode and overlaps both the first second-group first-color corresponding electrode and the second second-group first-color corresponding electrode,
wherein a first portion of the second group electrode electrically contacts the first auxiliary electrode and is positioned adjacent to the first second-group first-color corresponding electrode or the second second-group first-color corresponding electrode.

* * * * *